(12) United States Patent
Hikita et al.

(10) Patent No.: US 7,561,010 B2
(45) Date of Patent: Jul. 14, 2009

(54) PIEZOELECTRIC THIN FILM RESONATORS

(75) Inventors: Mitsutaka Hikita, Hachioji (JP);
Nobuhiko Shibagaki, Kokubunji (JP);
Atsushi Isobe, Kodaira (JP); Kengo Asai, Hachioji (JP); Hisanori Matsumoto, Kokubunji (JP)

(73) Assignee: Hitachi Media Electronics Co., Ltd., Mizusawa-Shi Iwate-ken (JP)

( * ) Notice: Subject to any disclaimer, the term of this patent is extended or adjusted under 35 U.S.C. 154(b) by 208 days.

(21) Appl. No.: 11/333,282

(22) Filed: Jan. 18, 2006

(65) Prior Publication Data

US 2006/0158283 A1 Jul. 20, 2006

(30) Foreign Application Priority Data

Jan. 18, 2005 (JP) ............................ 2005-010148

(51) Int. Cl.
*H03H 9/13* (2006.01)
*H03H 9/15* (2006.01)
*H03H 3/04* (2006.01)

(52) U.S. Cl. .................... 333/187; 310/357; 310/366
(58) Field of Classification Search ................ 333/187, 333/189; 310/356, 366, 357
See application file for complete search history.

(56) References Cited

U.S. PATENT DOCUMENTS

| | | | |
|---|---|---|---|
| 4,456,850 A * | 6/1984 | Inoue et al. ................. 310/324 |
| 5,283,037 A | 2/1994 | Baer et al. |
| 5,552,655 A * | 9/1996 | Stokes et al. ................. 310/330 |
| 6,242,843 B1 * | 6/2001 | Pohjonen et al. ......... 310/313 R |
| 6,437,482 B1 * | 8/2002 | Shibata ........................ 310/320 |
| 6,437,484 B1 * | 8/2002 | Nishimura et al. ........... 310/324 |
| 6,737,941 B1 * | 5/2004 | Tournois ..................... 333/193 |
| 6,842,087 B2 * | 1/2005 | Yamauchi .................... 333/187 |
| 2004/0227590 A1 * | 11/2004 | Larson et al. ................ 333/189 |
| 2005/0110598 A1 * | 5/2005 | Larson, III .................. 333/191 |

FOREIGN PATENT DOCUMENTS

JP 05-240762 9/1993
JP 2002-076835 3/2002

OTHER PUBLICATIONS

IEEE Ultrason. Symp. Proc., pp. 945-948 1998.
Electronic, Letters, vol. 35, No. 10, pp. 794 1999.
IEEE Ultrason. Symp. Proc., pp. 869-874 2000.

* cited by examiner

*Primary Examiner*—Barbara Summons
(74) *Attorney, Agent, or Firm*—Antonelli, Terry, Stout & Kraus, LLP.

(57) ABSTRACT

A piezoelectric thin film resonator is formed on a base substrate such as made of Si in which the resonance frequency is substantially determined by the lateral size not by the thickness of the resonator, whereby a resonator for use in TCXO, etc. is provided by the thin film technique, which enables to reduce the thickness of the film and the size of the resonator and integration with Si-based IC incorporating the resonator in one identical substrate.

8 Claims, 21 Drawing Sheets

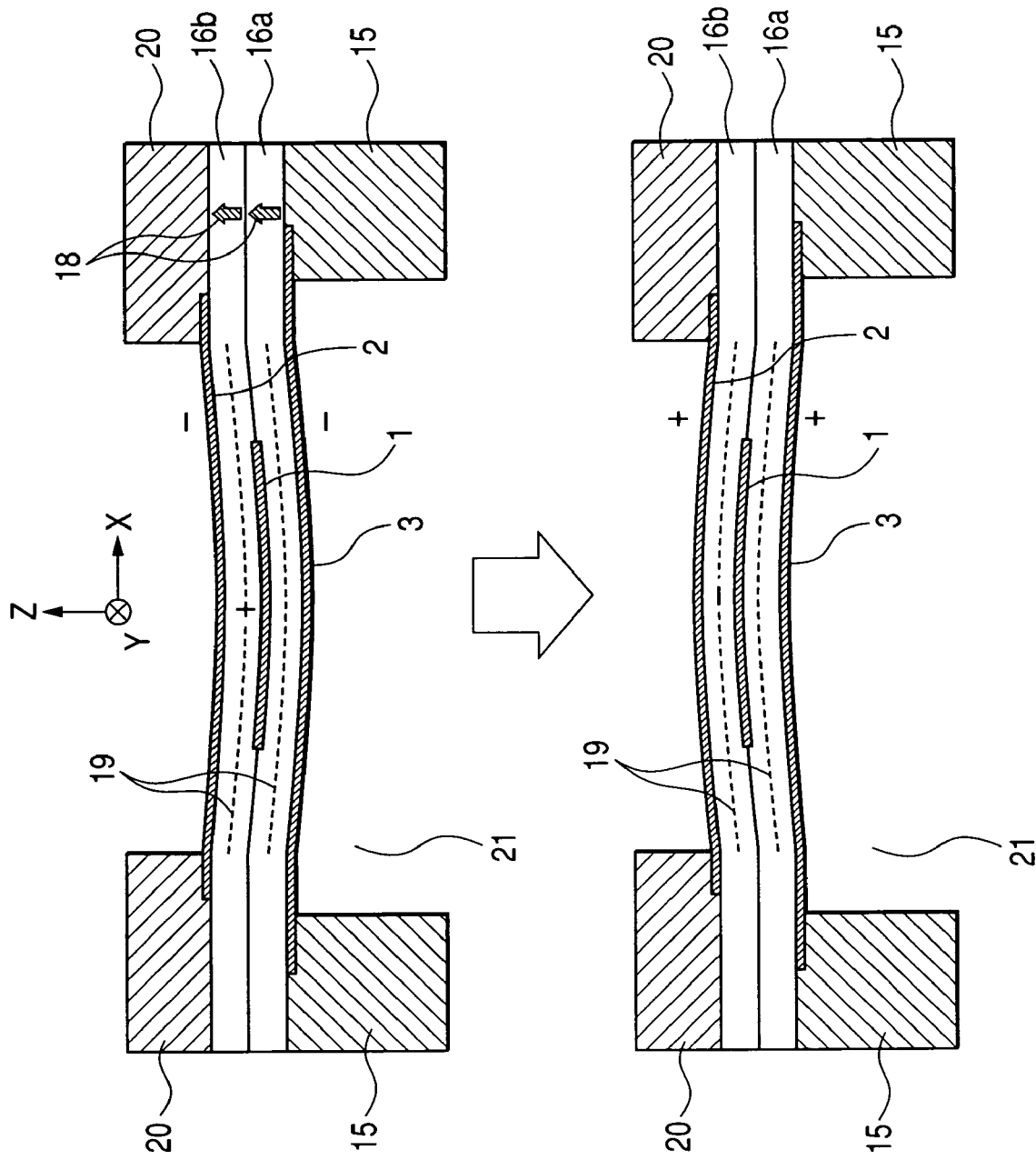

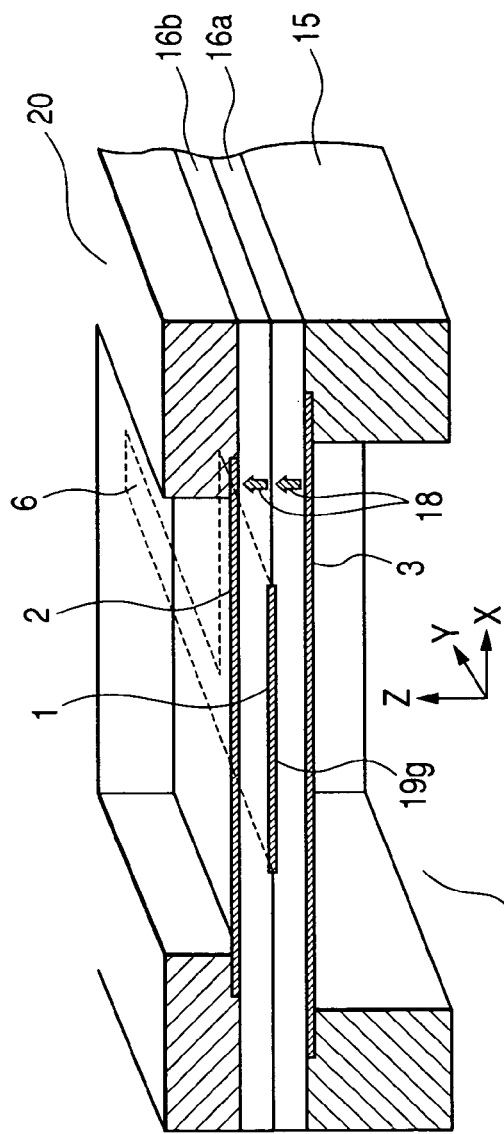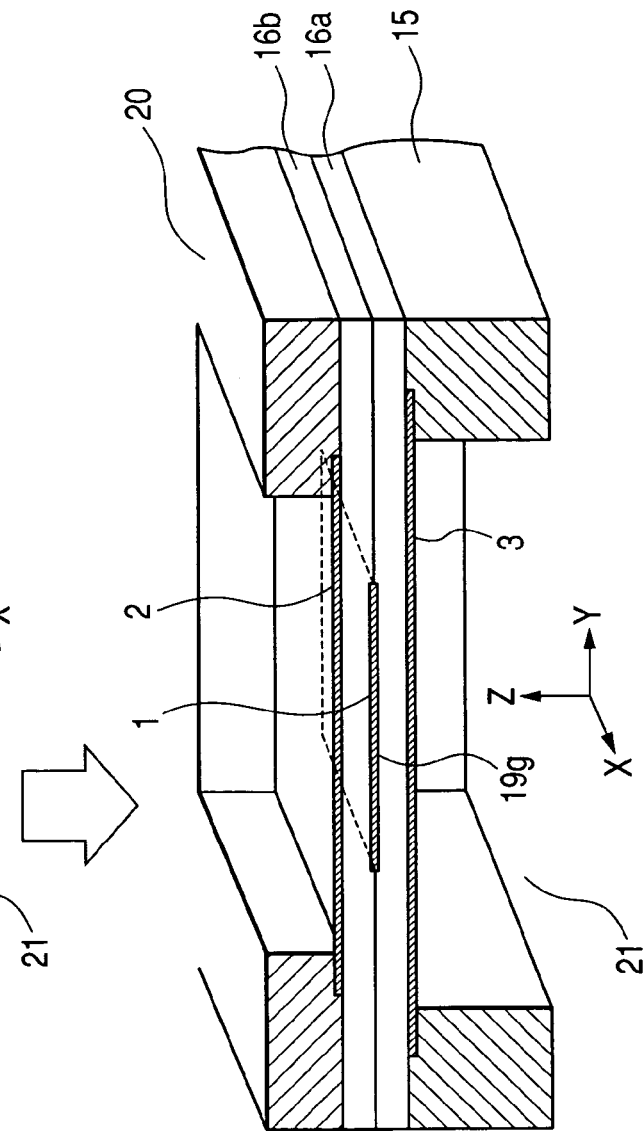
FIG. 4(a)
FIG. 4(b)

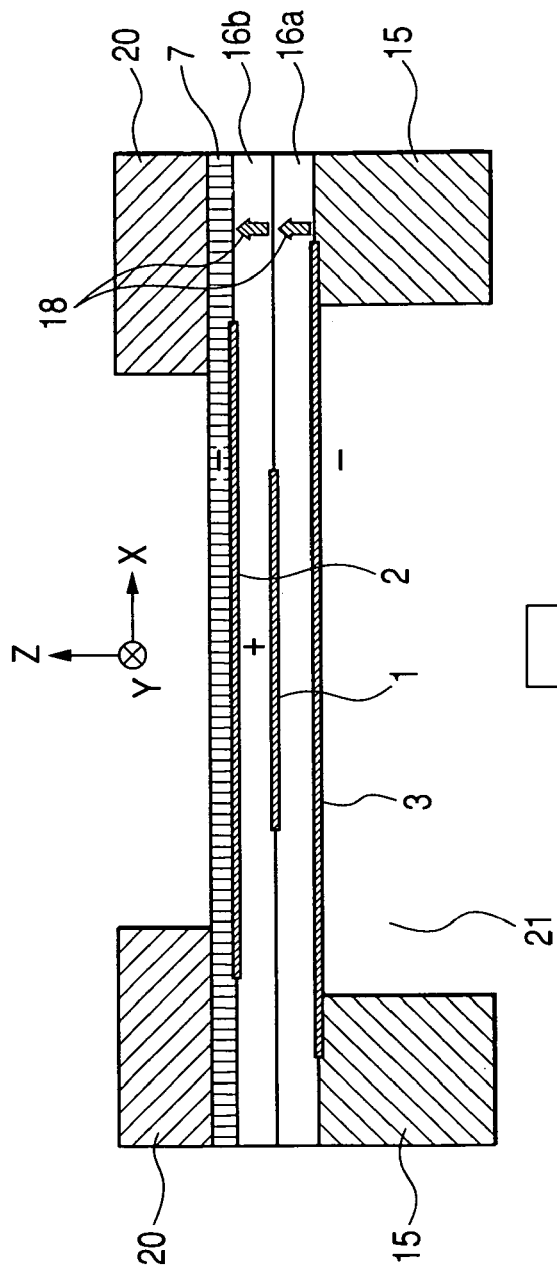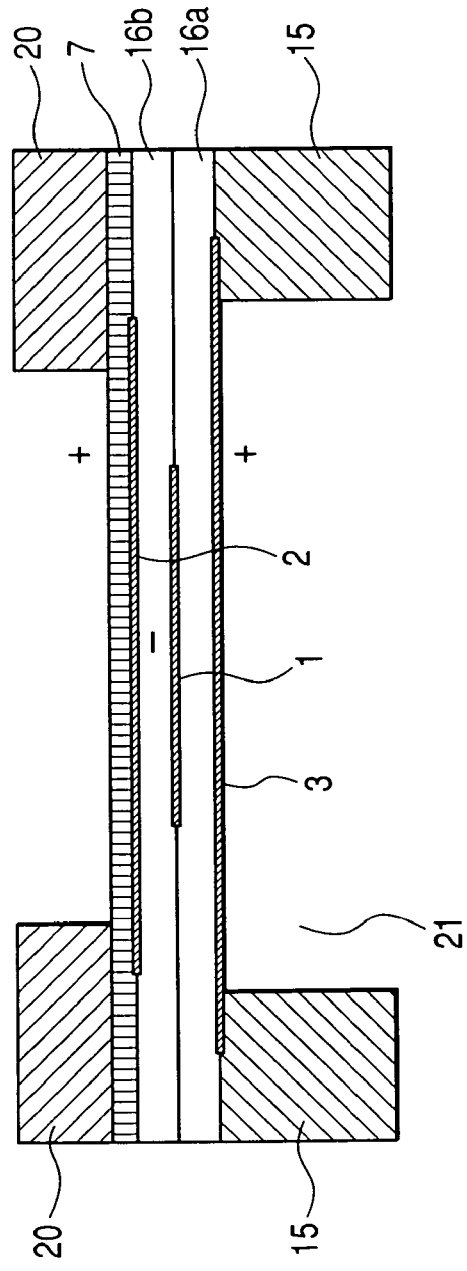

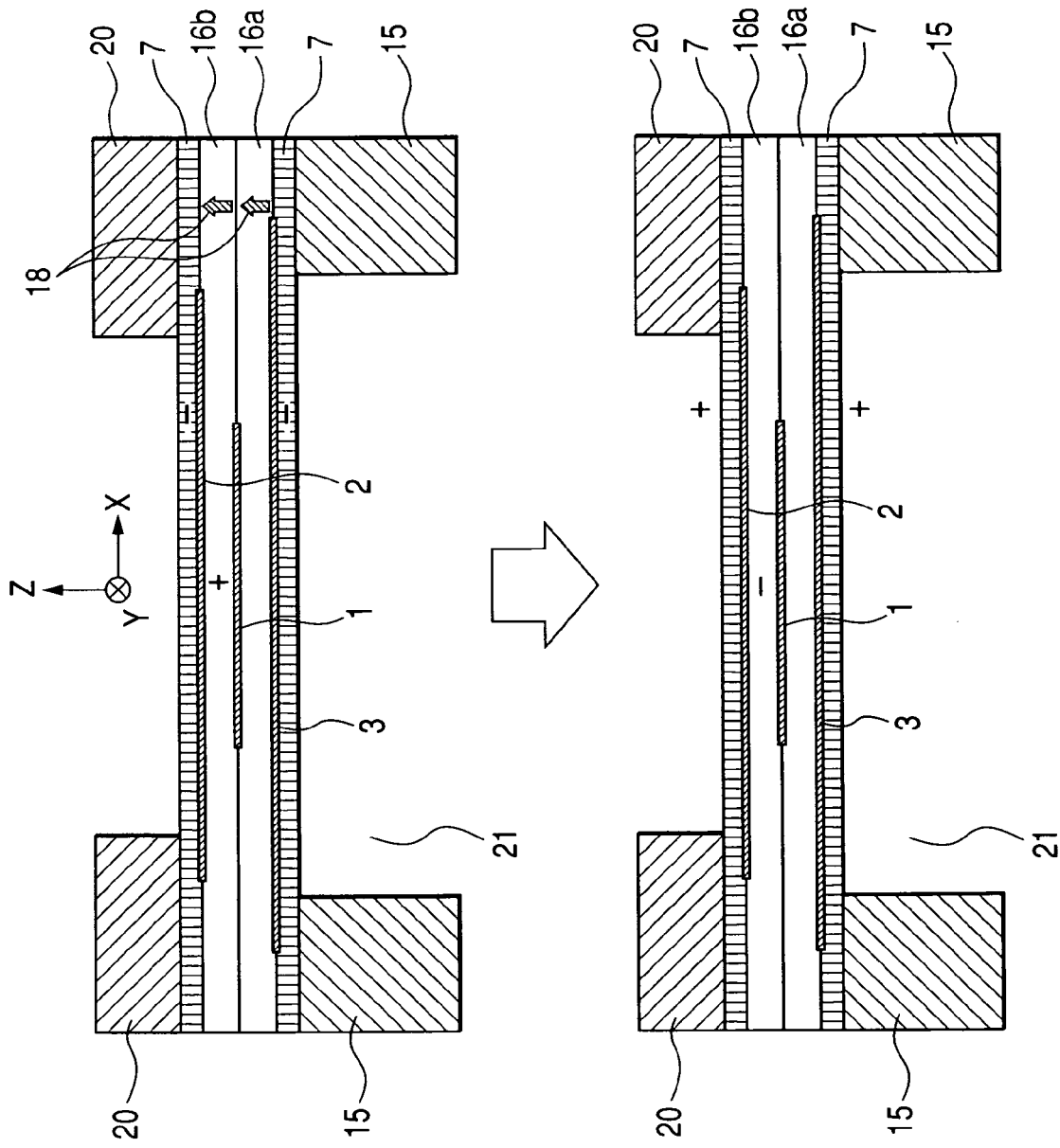

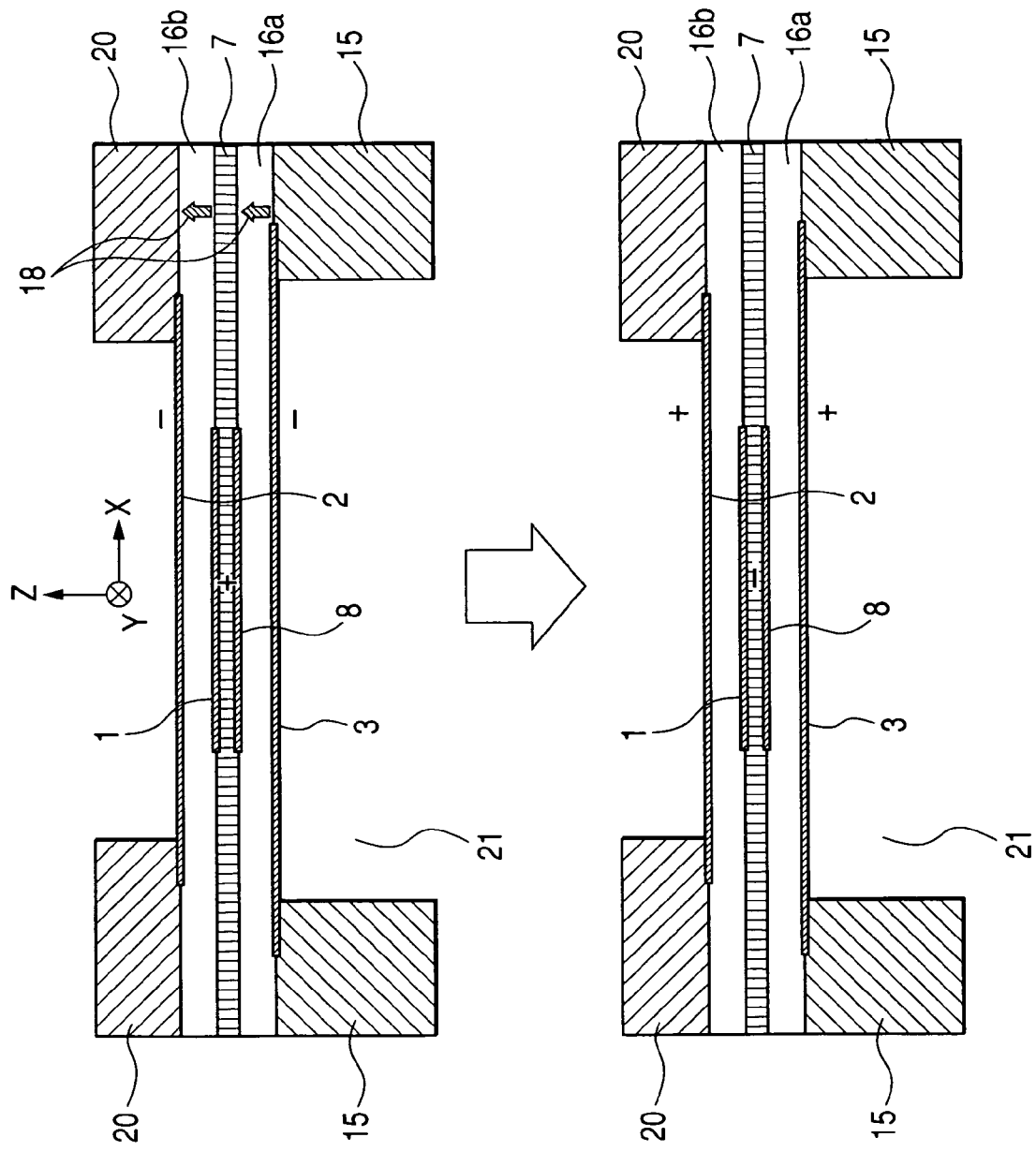

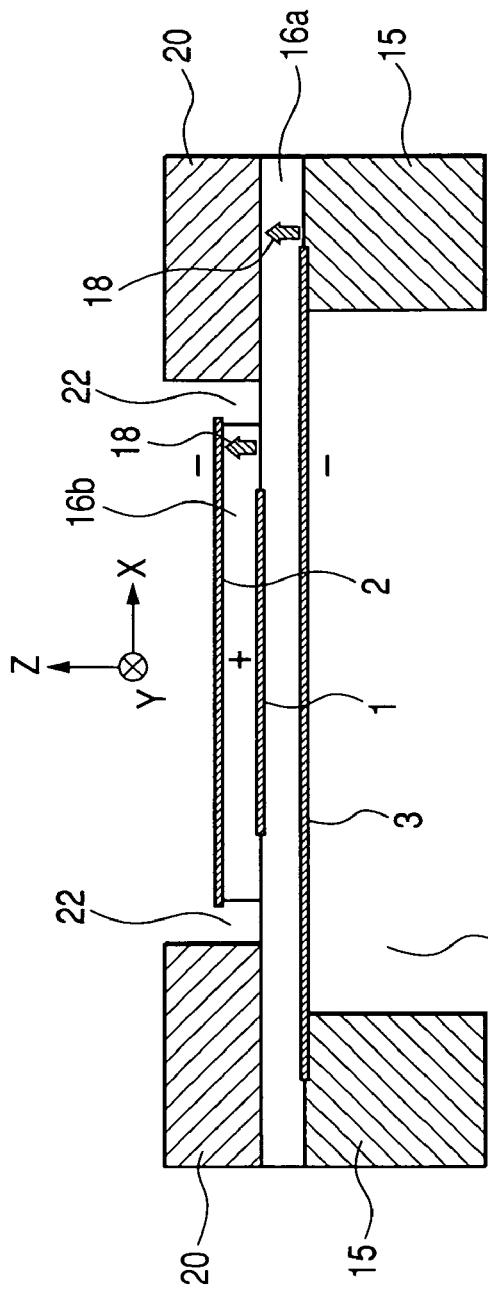
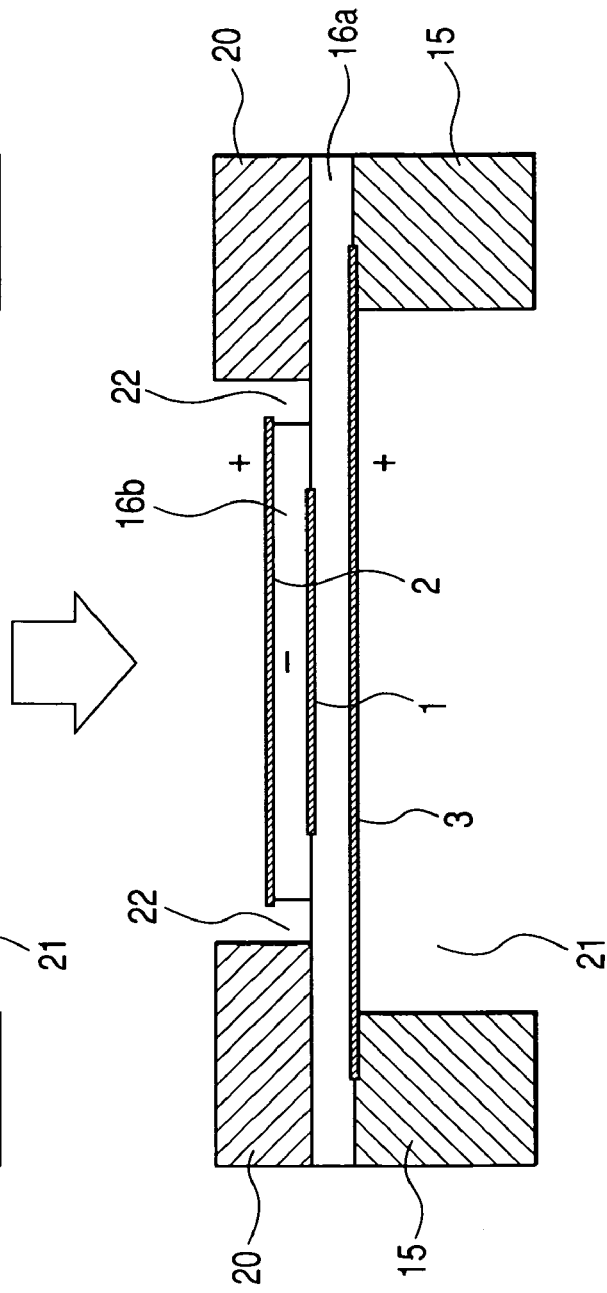
FIG. 8(a)
FIG. 8(b)

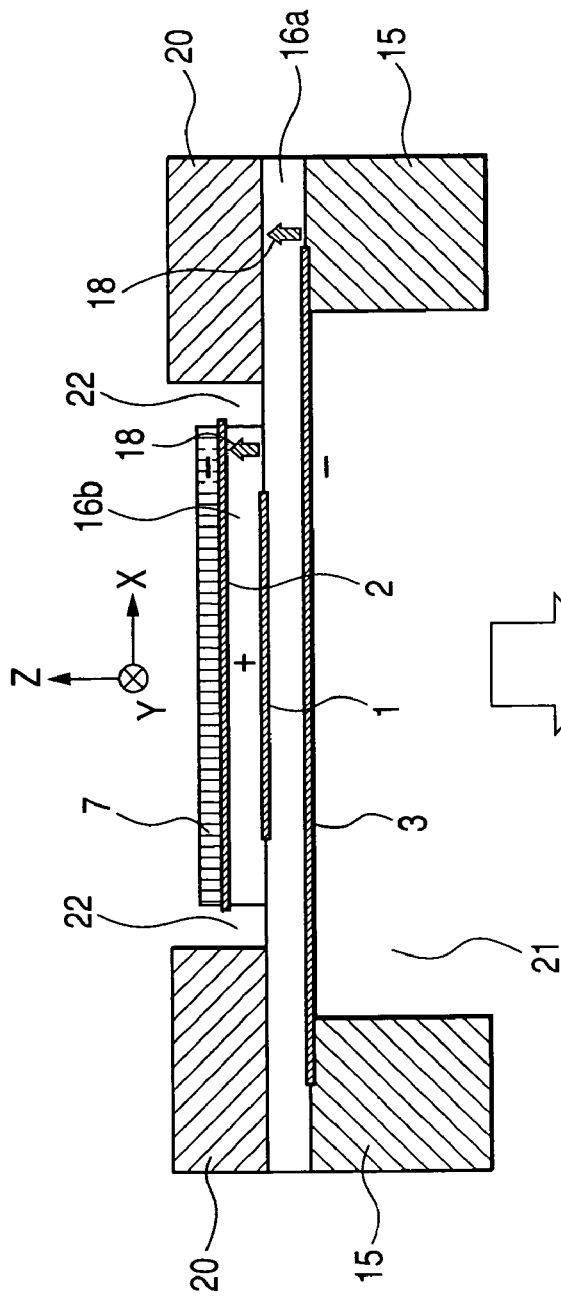
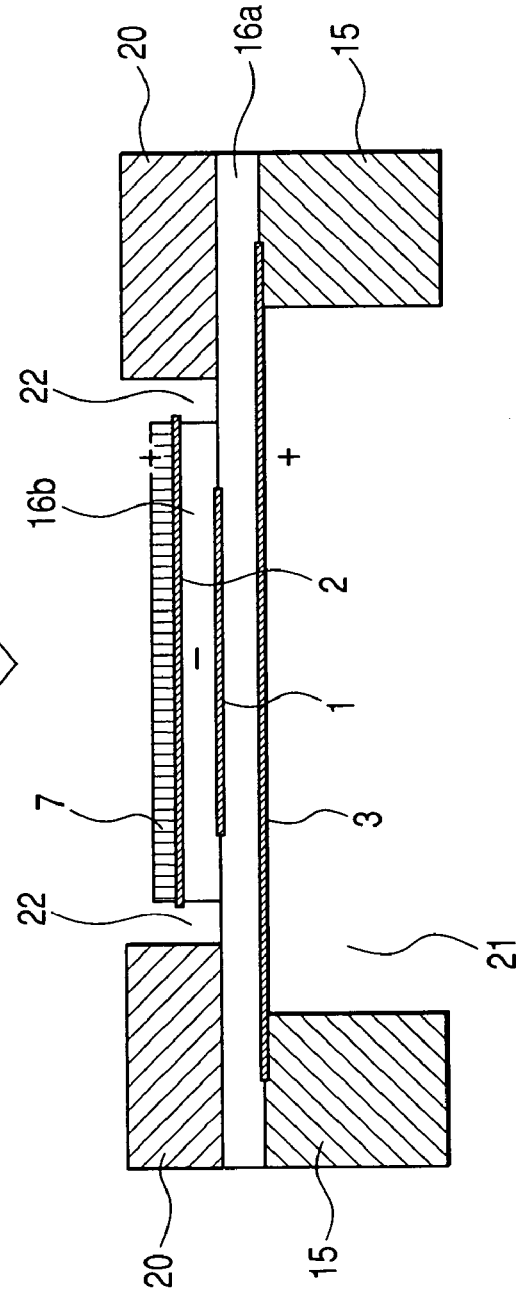
FIG. 9(a)
FIG. 9(b)

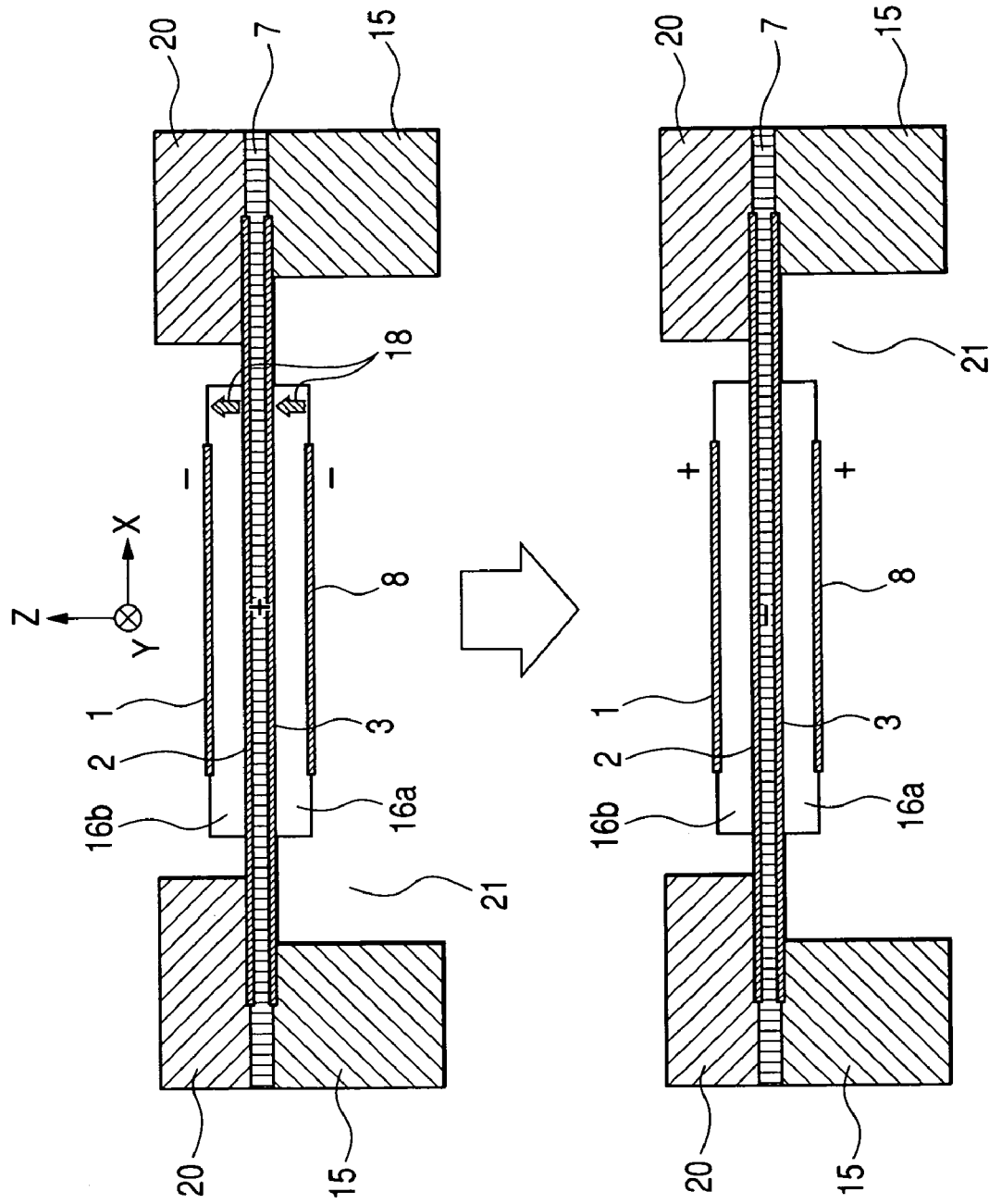

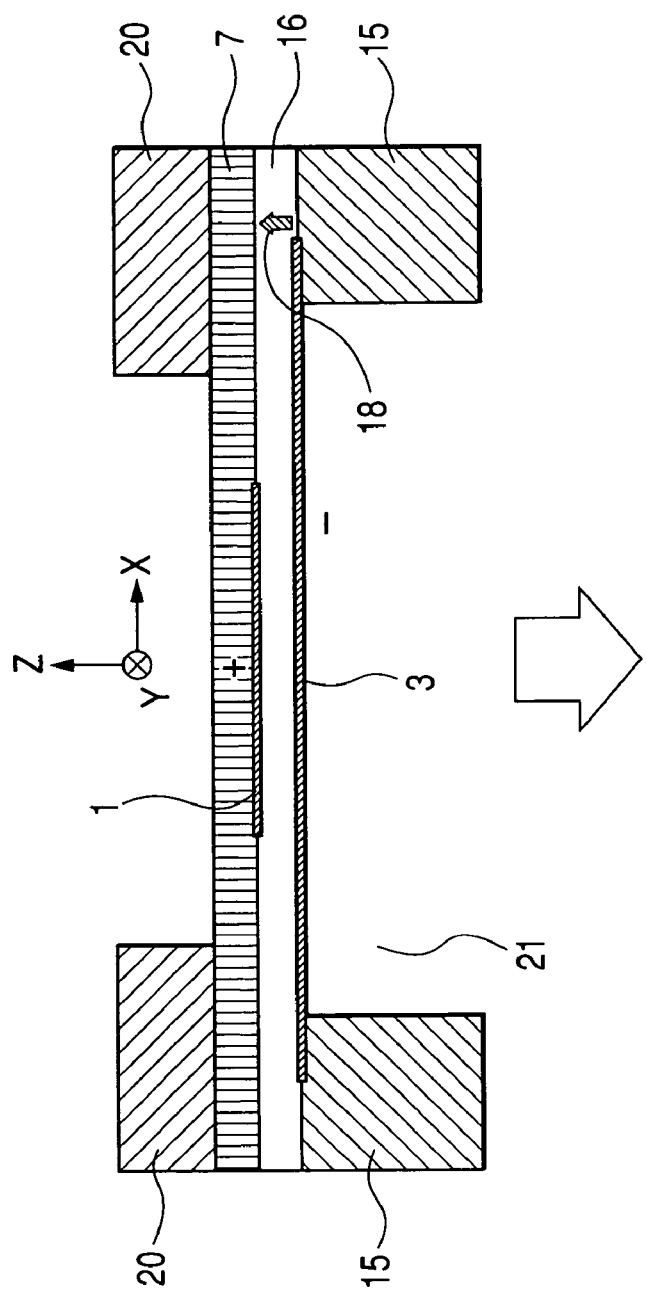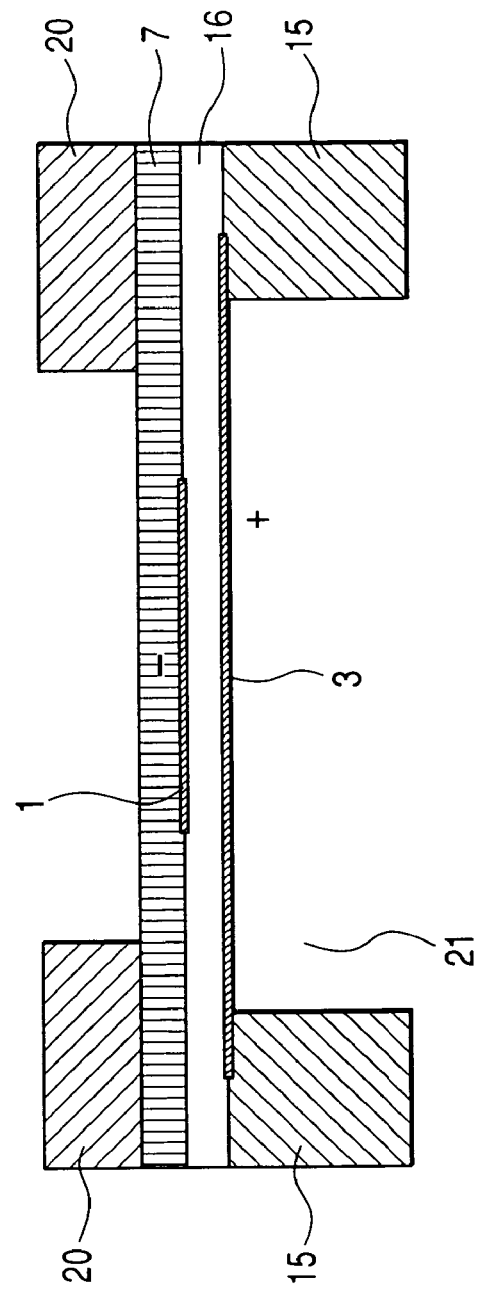
FIG. 11(a)
FIG. 11(b)

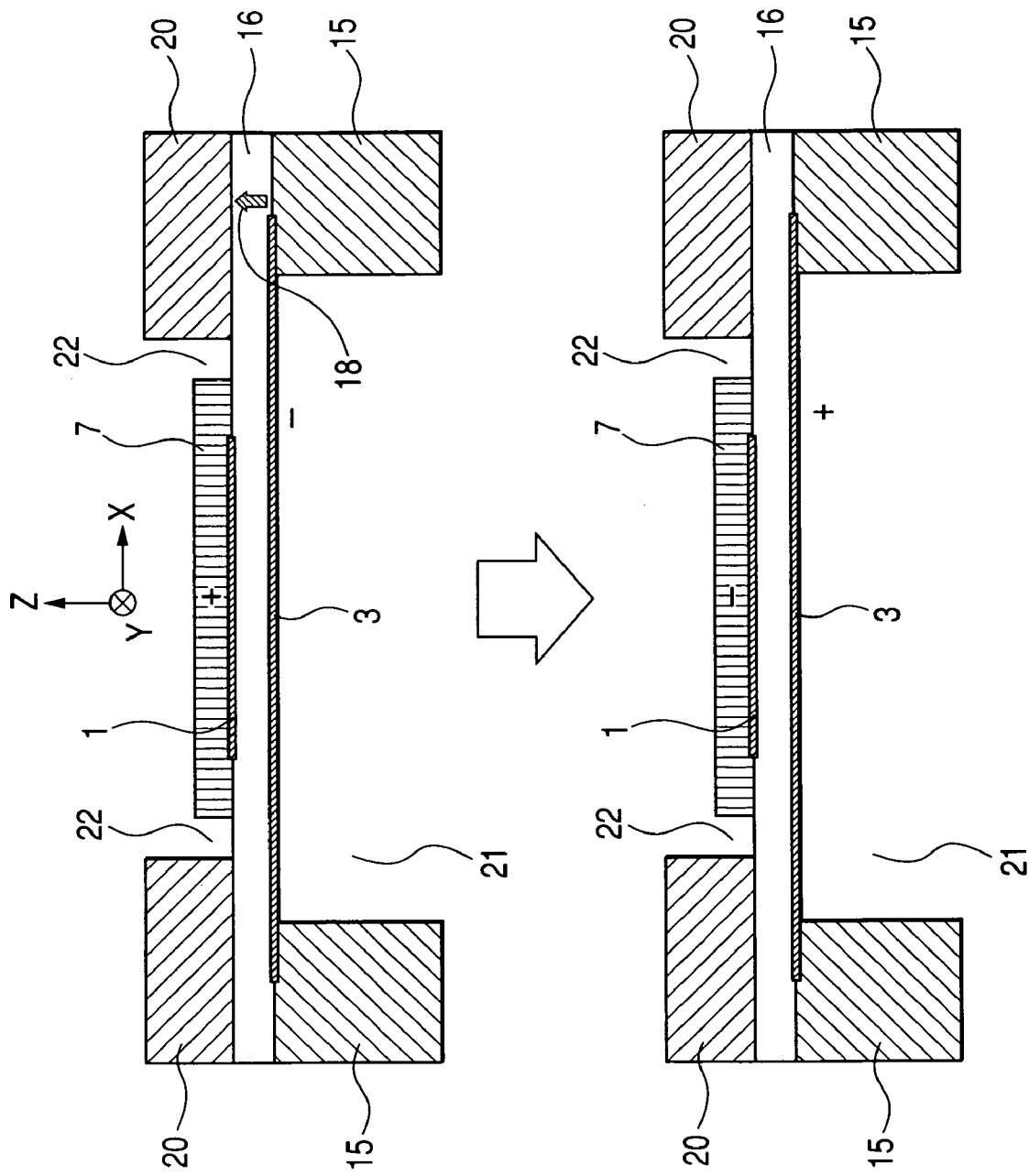

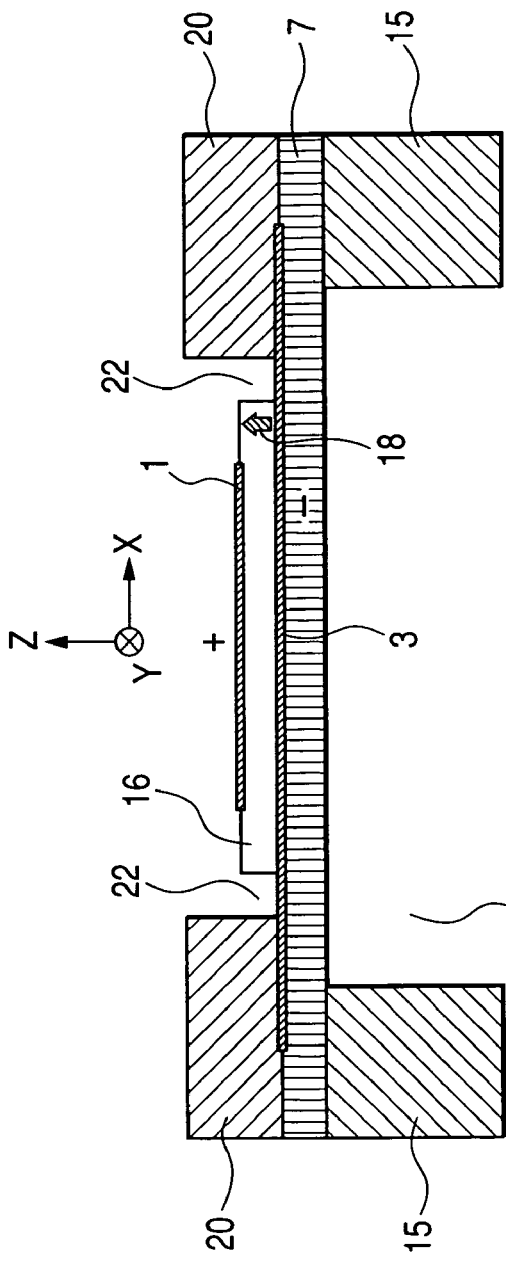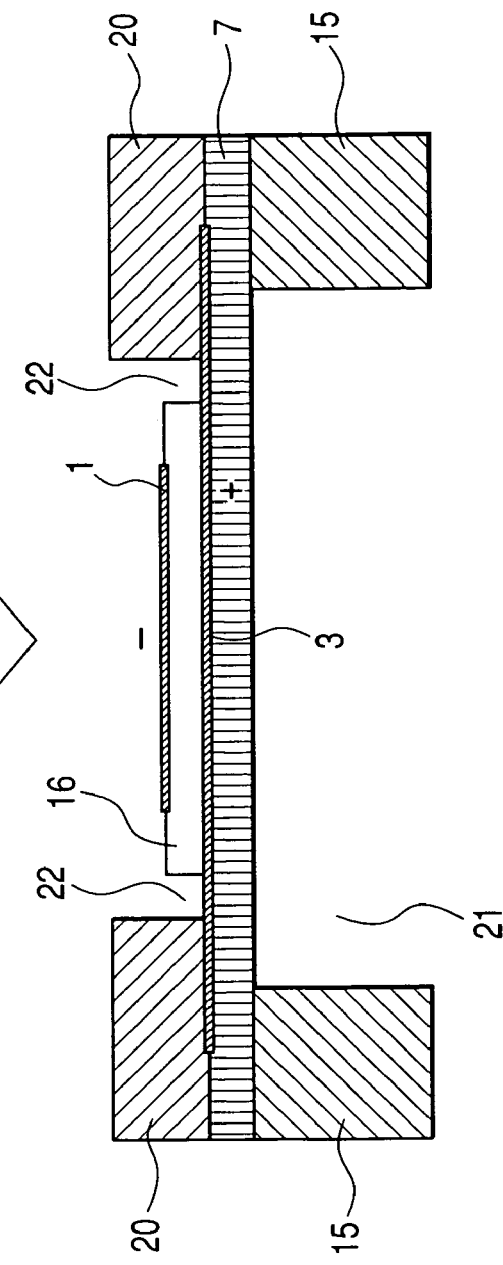
FIG. 13(a)
FIG. 13(b)

FIG. 21(a)
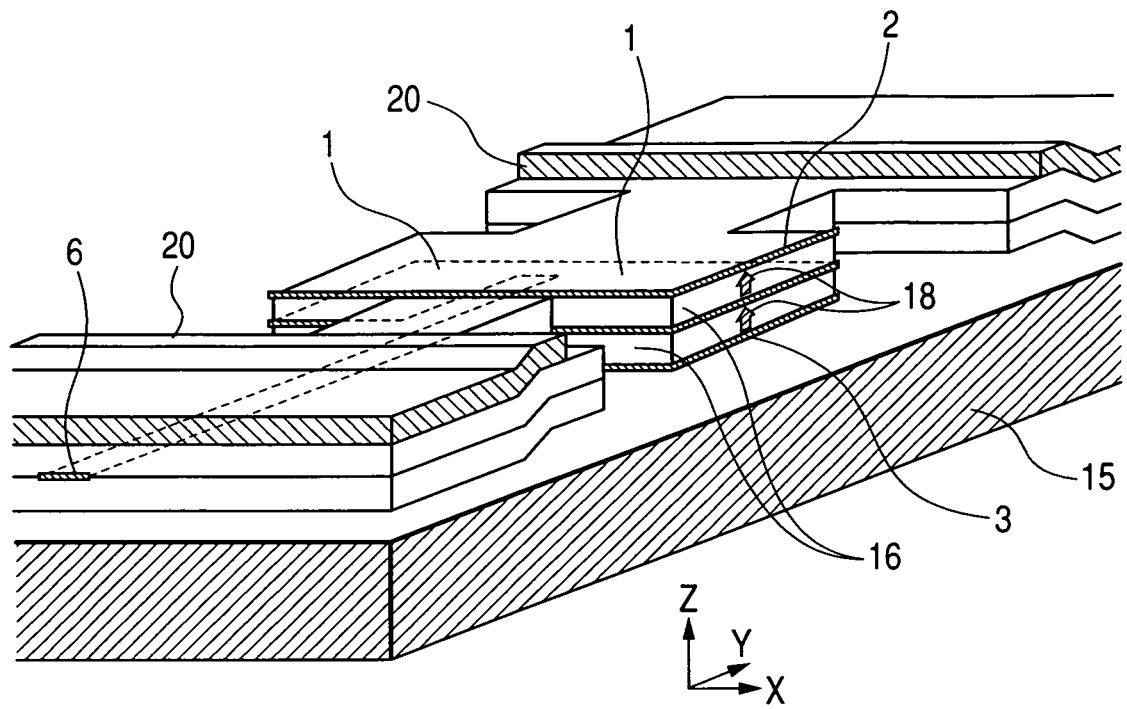
FIG. 21(b)
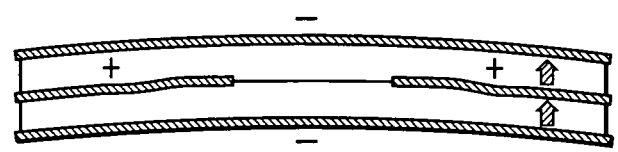
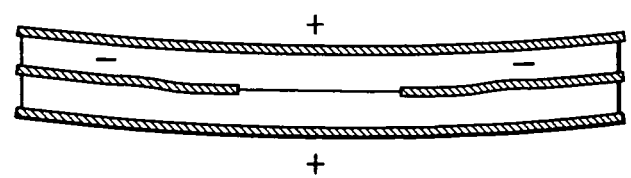

PIEZOELECTRIC THIN FILM RESONATORS

CLAIM OF PRIORITY

The present application claims priority from Japanese Application JP 2005-010148 filed on Jan. 18, 2005, the content of which is hereby incorporated by reference into this application.

FIELD OF THE INVENTION

The present invention concerns a resonator using a piezoelectric thin film, an oscillator using the same, and a semiconductor integrated circuit incorporating the same (herein after simply referred to as semiconductor IC).

BACKGROUND OF THE INVENTION

As the resonator, static type resonators using the MEMS technique have been reported so far (for example, refer to W. T. Hsu and T. C. Nguyen, Geometric Stress Compensation for Enhanced Thermal Stability in Micromechanical Resonators, in 1998 IEEE Ultrason. Symp. Proc., pp. 945-948 (1998)) (non-Patent Document 1).

Further, filter using an FBAR (Film-Bulk-Acoustic-wave Resonator: thin filmbulk resonator) as a prospective high frequency filter in 1.7 GHz to several GHz bands have been known (for example, refer to R. Ruby, P. Bradley, J. D. Larson III, and Y. Oshmyansky, PCS 1900 MHz Duplexer Using Thin Film Acoustic Resonators (FBAR), Electronics, Letters, Vol. 35, No. 10, pp. 794 (1999)) (non-Patent Document 2), and T. D; Larson III, R. Ruby, P. Brandley, J. Wen, S. L. Kok, and A. Chien, Power Handling and Temperature Coefficient Studies in FBAR Duplexers for the 1900 MHz PCS Bands, in 2000 IEEE Ultrason. Symp. Proc., pp. 869-874, (2000)) (non-Patent Document 3).

In addition, relevant arts to those described above include, for example, those concerning surface transverse wave device for generating and propagating surface transverse waves (STW) on a piezoelectric substrate having appropriate composition and cut (refer to Japanese Laid-Open No. 5-240762) (Patent Document 1) and those concerning elastic surface wave element using transverse elastic surface waves (STW) as the oscillation mode (refer to Japanese Laid-Open No. 2002-76835) (Patent Document 2).

SUMMARY OF THE INVENTION

In electronic equipment such as portable telephones, personal computers and digital cameras, several kinds of standard oscillators from several MHz to several 10 MHz are incorporated for taking synchronization for electronic parts (circuits) in the equipment. Oscillators using quartz oscillators have been used so far. However, quarts resonators are formed by cutting out crystal block, and reducing the thickness in the oscillation direction to about one-half of the wavelength of the oscillation at the resonance frequency by polishing or the like. Accordingly, they are large in volume by nature and can not be integrated with Si-based IC in a case of forming an oscillator.

On the other hand, since Si is used as a base substrate in MEMS (Micro-Electro-Mechanical Systems) technique, it is compatible with the Si-based IC. The technique disclosed in the Non-Patent Document 1 is an example of the static resonator using the MEMS technique.

However, while the resonator using the MEMS technique has a merit such as integration with the Si-based IC, since it conducts coupling with electric oscillations basically by using the capacitance coupling between electrodes, electric impedance is extremely high to involve various problems such as mismatching with an electric system in a case of constituting the oscillator.

As shown in schematic cross sectional view of FIGS. 2A, 2B, an FBAR filter has a basic constitution of forming an AlN (aluminum nitride) piezoelectric thin film 16 on an Si substrate 15. Further, metal films such as of Mo (molybdenum) that constitute an electrode 4 and an electrode 5 are formed on upper and lower surfaces of the AlN thin film 16.

As shown in FIGS. 2A, 2B, the AlN thin film 16 can vibrate freely by forming a concavity 17 to the surface of the Si substrate corresponding to a vibrating portion of the AlN thin film. FIG. 2A shows a state of applying a positive voltage (+) to the electrode 4 and a negative voltage (−) to the electrode 5, and FIG. 2B shows a state of applying a voltage at the polarities opposite thereto, respectively.

For constituting an RF filter, a plurality of FBAR filters shown in FIGS. 2A, 2B are formed in a single Si chip and are connected in the constitution, for example, of a ladder type or lattice type in accordance with the circuit theory.

While the FBAR (thin film bulk resonator) of FIGS. 2A, 2B has been known so far as a concept and the result of basic experiment has been also reported long since, this has not yet been put to practical use. In recent years, it has been put to practical use rapidly since sputtering apparatus, CVD apparatus, etc. capable of forming the piezoelectric thin film 16 such as an AlN thin film at extremely high accuracy have been developed as one of factors.

In most of FBAR filters, the base substrate 15 comprises Si and also the processing apparatus forming FBAR are common with the apparatus for preparing Si-based IC. Coexistent and integration of FBAR filters and Si-based IC will also be possible in the future.

FBAR in FIGS. 2A, 2B or FBAR filters in combination of them are compatible with the Si-based IC, and most of portions of the processing apparatus can be used in common. Accordingly, an oscillator can be constituted by using the FBAR in the same manner as existent crystal resonators and combining them with Si-based active elements (IC).

An oscillator of an extremely small size can be obtained by incorporating the FBAR simultaneously in the Si-based IC. However, there exists a significant problem in that the thickness of the vibrating portion including the piezoelectric thin film 16 of the FBAR requires about one-half of the wavelength ($\lambda$) of oscillations at the resonance frequency.

This means that $\lambda/2=2.5$ μm in FBAR for 2 GHz band. In the existent sputtering apparatus or CVD apparatus, thin films of several μm thickness can be formed at a high accuracy, and FBAR with the thickness of the piezoelectric thin film 16 at 2.5 μm can also be obtained substantially theoretically.

Then, assuming a quartz oscillator of several tens MHz used at present and it is considered to obtain a resonator, for example, for a 20 MHz band by FBAR. In this case, the thickness of the piezoelectric thin film is: $\lambda/2\approx250$ μm. Such a thickness can not be said to be a thin film and it is extremely difficult to form a film of such a thickness by the thin film forming technique such as sputtering or CVD and it is not practical.

Accordingly, the invention intends to overcome the problems in the prior art and provide an improved resonator capable of easily decreasing the size and the film thickness, an oscillator using the same and a novel semiconductor IC incorporating the same in one identical substrate with a semiconductor integrated circuit.

In the existent FBAR, the gravitational center 19g substantially at the center line of FBAR is not displaced by the application voltage and the direction of displacement of the oscillation is reversed at the gravitational center 19g as a boundary as shown in FIGS. 2A, 2B. That is, in FIG. 2A showing application of a positive (+) voltage to the electrode 4 and a negative (−) voltage to the electrode 5, in a case where the upper half is displaced upward by displacement 19a, the lower half is displaced downward by displacement 19b with respect to the center of the piezoelectric thin film 16 (position for gravitational center 19g) as a boundary. Further, in FIG. 2B where the electrode potential is reversed, displacement is also reversed and in a case where the upper half is displaced by 19a downward, the lower half is displaced by 19b upward.

Generally, in the oscillations described above, the energy of oscillation propagates upward and downward of the piezoelectric thin film, oscillations are reflected at the upper and lower surfaces of the thin film, by which static waves are generated to cause a resonating phenomenon. Further, since the propagating direction of the oscillations is perpendicular and the direction of the main component of the displacement in the oscillations of the piezoelectric thin film 16 is also perpendicular, such oscillation is referred to oscillation by longitudinal waves. For example, since the acoustic velocity of the longitudinal waves in AlN is: $V1 \approx 10360$ μm/s, $\lambda/2 = (V1/(2\times 10^9))/2 \approx 2.5$ μm in the 2 GHz band. Since the wavelength is in inverse proportion with the frequency, the film thickness is excessively thick as: $\lambda/2 = (V1/(2\times 10^9))/2 \approx 250$ μm in the 20 MHz band, which is not a practical value.

The present invention has been accomplished for solving such a problem and one of typical examples is as shown below. That is, according to the invention, the piezoelectric thin film resonator includes two or more layers of dielectric thin film portion containing at least one layer of piezoelectric thin films, at least a pair of electrodes formed above and below at least one layer in the piezoelectric thin film, and feed terminals for applying a voltage the polarity of which is inverted periodically to the electrodes, in which the dielectric thin film portion oscillates based on the voltage applied to the electrodes, wherein the resonator has a dielectric thin film portion in which the displacement component perpendicular to the plane of all the dielectric thin films is predominant for the displacement of oscillation in the dielectric thin films at the resonance frequency, and the direction of the displacement perpendicular to the plane is uniform along the cross section perpendicular to the plane.

Further, in a preferred embodiment of the piezoelectric thin film resonator, a fixed portion and a not-fixed portion are disposed to the outer periphery of the piezoelectric thin film resonator, a voltage the polarity of which is inverted periodically is supplied from the feed terminals to the pair of electrodes, and the non-fixed portion is oscillated based on the potential difference caused between the electrodes thereby generating standing waves in the planar direction of the piezoelectric thin film.

Further, in a piezoelectric thin film oscillator according to another aspect of the invention, a resonator of the colpitts type oscillation circuit is constituted with the piezoelectric thin film resonator described above.

Further, in a semiconductor integrated circuit according to a further aspect of the invention, a piezoelectric thin film oscillator is formed integrally in one identical substrate where a semiconductor device is incorporated, and the piezoelectric thin film oscillator is constituted with the piezoelectric thin film resonator described above.

According to the invention as described above, a piezoelectric thin film resonator can be formed easily. Further, according to the invention, the size of the piezoelectric thin film resonator can be decreased.

BRIEF DESCRIPTION OF THE DRAWINGS

FIGS. 1A, 1B are cross sectional views of a resonator for explaining a first example of the invention;

FIGS. 4A, 4B are perspective cross sectional views of a resonator for explaining the first example of the invention;

FIGS. 5A, 5B are cross sectional views of a resonator for explaining a second example of the invention;

FIGS. 6A, 6B are cross sectional views of the resonator for explaining the second example of the invention;

FIGS. 7A, 7B are cross sectional views of the resonator for explaining the second example of the invention;

FIGS. 8A, 8B are cross sectional views of a resonator for explaining a third example of the invention;

FIGS. 9A, 9B are cross sectional views of the resonator for explaining the third example of the invention;

FIGS. 10A, 10B are cross sectional views of the resonator for explaining the third example of the invention;

FIGS. 11A, 11B are cross sectional views of a resonator for explaining a fourth example of the invention;

FIGS. 12A, 12B are cross sectional views of the resonator for explaining the fourth example of the invention;

FIGS. 13A, 13B are cross sectional views of the resonator for explaining the fourth example of the invention;

FIG. 21A is a perspective view of the resonator for explaining the eighth example of the invention;

FIG. 21B is a cross sectional view of the resonator for explaining the eighth example of the invention.

DETAILED DESCRIPTION OF THE PREFERRED EMBODIMENTS

Preferred embodiments of the invention are to be described.

Figures 2A, 2B:
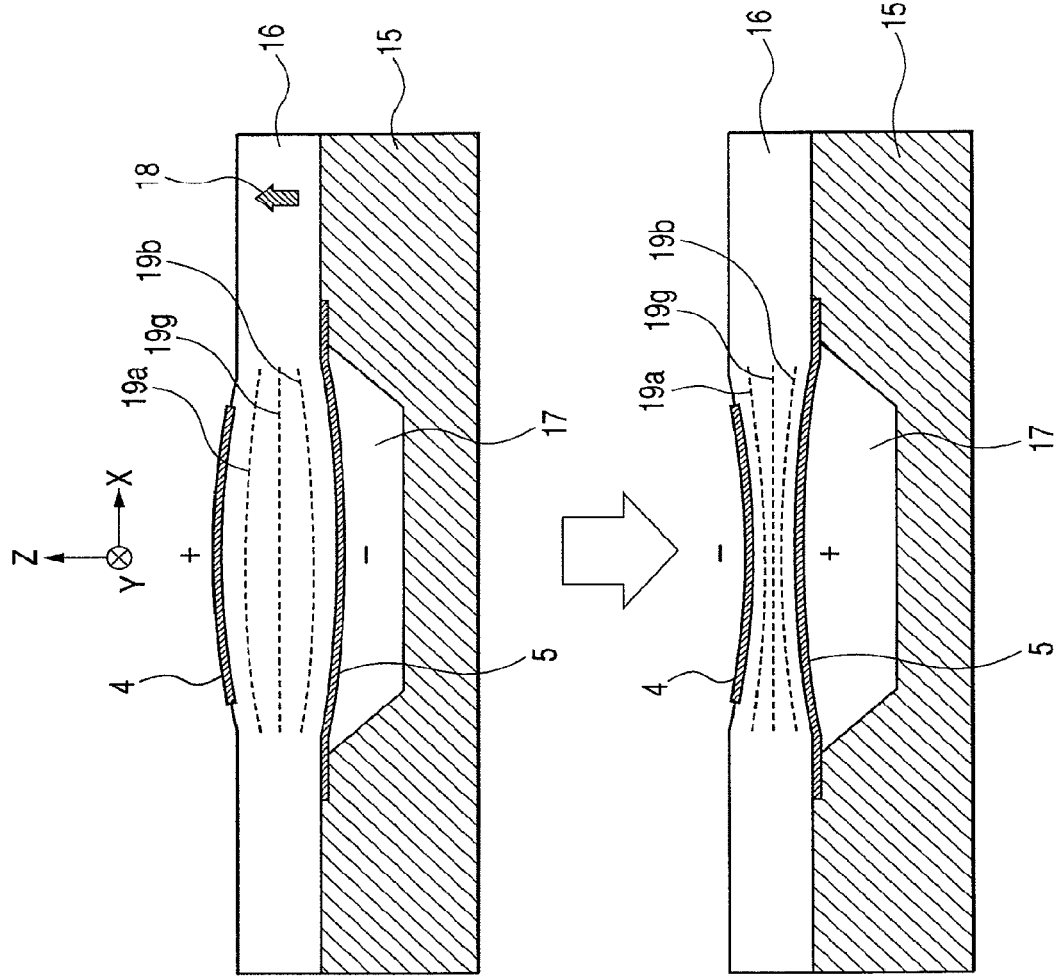
FIGS. 2A, 2B are cross sectional views of an existent FBAR resonator.

At first, in the invention, oscillations in which the gravitational center per se of a piezoelectric thin film is displaced are used instead of oscillations where the gravitational center 19g is not displaced as in the existent FBAR in FIGS. 2A, 2B.

Specifically, the direction of the main displacement component of oscillations is in the direction of the thickness of the piezoelectric thin film, that is, perpendicular direction in the same manner as described above, but it is always uniform within the cross section of the piezoelectric thin film and the direction of the displacement is not reversed at the gravitational center 19g as the boundary as in the existent FBAR. In FIGS. 2A, 2B for the existent structure, the central portion of the piezoelectric thin film 16 expands and contracts in the cross section depending on the polarity of the voltage applied to the electrode.

Further, in the invention, the energy of oscillations propagates rightward and leftward of the piezoelectric thin film. That is, they are reflected at the leftward and rightward ends to generate standing waves and exhibit resonating phenomenon. The direction of the main displacement component of oscillations is perpendicular and since the propagating direction of the oscillations is leftward and rightward, they are oscillations using transverse waves.

In a case where the piezoelectric thin film 16 is made of AlN, since the acoustic velocity of the transverse waves is: $Vsv \approx 6057$ m/s, $\lambda/2 = (Vsv/(2 \times 109)/2 \approx 150$ μm in the 20 MHz band. However, since the value is for the transverse waves, it is not the thickness of the piezoelectric thin film but the size in the direction of width of the piezoelectric thin film. In view of the reason described above, it is necessary to exactly control the size in the direction of the width not in the direction of the thickness of the piezoelectric thin film. With respect to the thickness of the piezoelectric thin film, it has little relation with the resonance frequency and rather this is determinative factor for electric impedance.

According to the embodiment described above, a piezoelectric thin film resonator can be formed easily to an Si base substrate by a well-known thin film forming technique, and the film thickness of the piezoelectric thin film itself is not a factor for determining the frequency but the size in the direction of the width of the thin film resonator determines the resonance frequency. Accordingly, a resonator operating at several tens MHz can be formed with an extremely thin piezoelectric thin film in the same manner as in the existent 2 GHz band FBAR, and the size in the direction of the width of the resonator is extremely small as about 150 μm also at 20 MHz.

At a higher frequency, the size in the direction of the width decreases in inverse proportion to the frequency. Accordingly, the size can be decreased greatly compared with a resonator using an existent quartz oscillator.

Further, since the resonator can be manufactured by using the same thin film forming technique as the manufacturing process for semiconductor IC, a semiconductor IC incorporating a resonator can be obtained by using a substrate in common with the semiconductor IC. For example, by the coexistence of the resonator in one identical chip with that for the Si-based IC, the size of a standard oscillator or the like can further be decreased.

Examples of the present invention are to be described specifically with reference to the drawings.

EXAMPLE 1

FIGS. 1A, 1B are cross sectional structural views showing a first embodiment of a resonator according to the invention. At first, the basic constitution and the principle of the invention are to be described based on the drawing. In FIGS. 1A, 1B, two layers of piezoelectric dielectric thin films having identical direction of polarization 18, that is, piezoelectric thin films 16a, 16b are formed above a base substrate 15 such as made of Si. An electrode 1 is disposed between two sheets of piezoelectric thin films 16a and 16b, and electrodes 2, 3 are formed on the upper and lower piezoelectric thin films while sandwiching them. Reference 18 in the drawing shows polarization of the piezoelectric thin film 16 and 20 shows a clamp pattern respectively.

When a high frequency voltage is applied between the electrode 1 and the electrodes 2, 3, in the case of FIG. 1A where the electrode 1 is at a positive and electrodes 2, 3 are at a negative potentials, since the direction of the electric field and the direction of the polarization are equal in the piezoelectric thin film 16b of the upper layer, the piezoelectric thin film contracts. Since the direction of the electric field and the direction of the polarization are opposite in the piezoelectric thin film 16a of the lower layer, the piezoelectric thin film expands. Accordingly, in the two sheets of piezoelectric thin films 16a, 16b, the thickness of the upper layer 16b is decreased and that of the lower layer 16a is increased. This corresponds to that the gravitational center 19g of the piezoelectric thin film in the direction of the thickness moves downward, that is, in the direction −Z.

On the other hand, in a case of FIG. 1B where the electrode 1 is at a negative and electrodes 2, 3 are at a positive potential, since the direction of the electric field and the direction of the polarization are opposite in the piezoelectric thin film 16b of the upper layer and the direction of the electric field and the direction of the polarization are identical in the piezoelectric thin film 16a of the lower layer, the thickness of the upper layer 16b is increased and that of the lower layer 16a is decreased. In this case, the gravitational center 19g of the piezoelectric thin film moves upward, that is, in the direction +Z.

Figure 3:
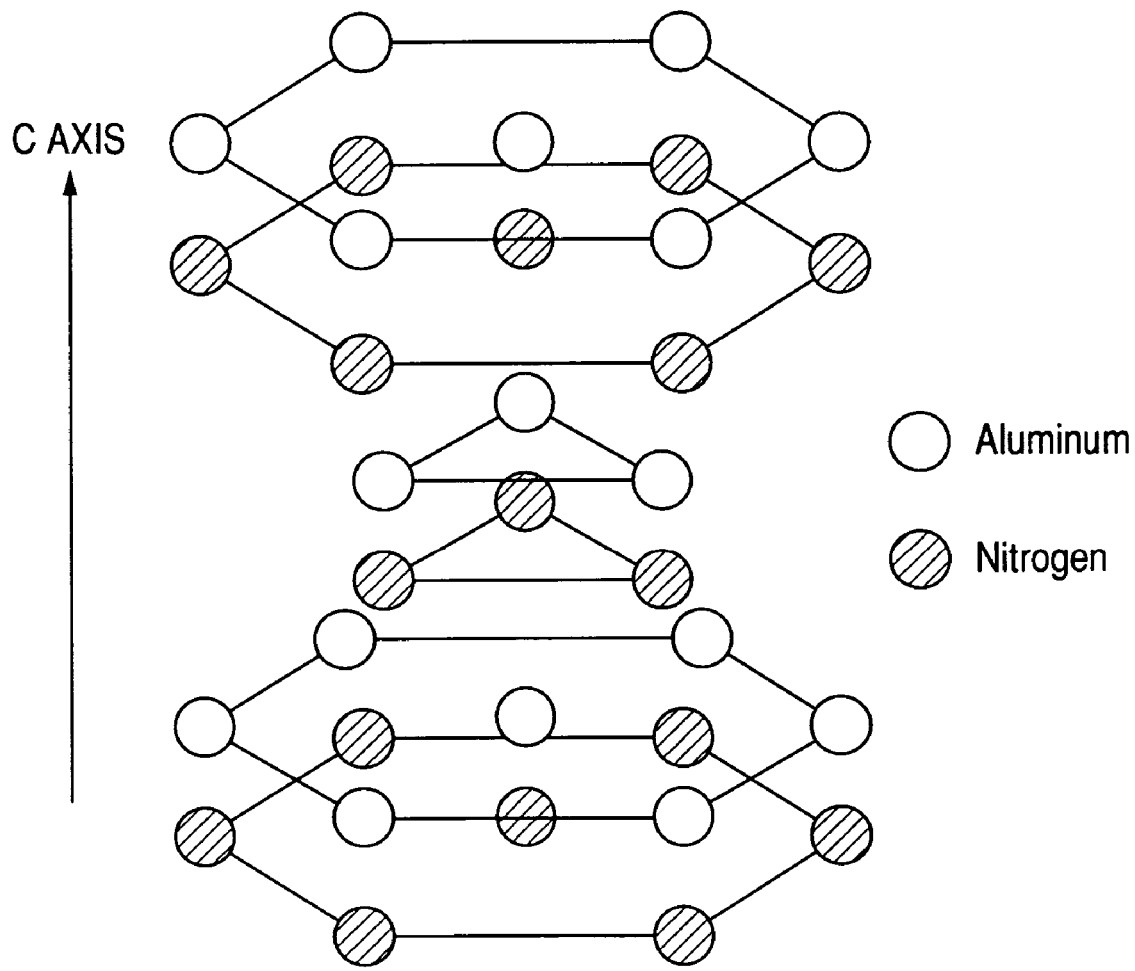
FIG. 3 is a view showing the crystal structure of a hexagonal system (AlN, etc.) of a piezoelectric crystal.

Referring to the polarization, FIG. 3 shows an example of a diagram for the crystal structure in which the piezoelectric thin film 16 comprises, for example, AlN. In a case of a hexagonal system (6 mm group) as shown in FIG. 3, crystal faces are formed as a combination of hexagonal prisms. The hexagonal prisms grow by repeating Al atom layers and N atom layers alternately. The direction of the hexagonal prisms is referred to as the direction of C-axis and they are polarized in the direction of C-axis. That is, the hexagonal prism itself contracts and expands by the electric field component in the direction of the C axis (polarization).

In FIGS. 1A, 1B, in a case of fixing the piezoelectric thin film on the right and left by using the clamp pattern shown in FIG. 20, perpendicular movement of the gravitational center 19g of the piezoelectric thin film 16 causes oscillations with both right and left ends as fixed sides and the central portion (corresponding to gravitational center 19g) as a loop. The oscillation is different from that in FBAR in FIGS. 2A, 2B and the directions of displacement in the two sheets of piezoelectric thin films 16a, 16b are identical respectively and the direction is not reversed at the gravitational center 19g as the boundary as in FBAR.

Further, assuming the right to left direction in FIGS. 1A, 1B as a direction X, oscillations propagate to the direction X and are reflected at the fixed sides on the right and left to generate standing waves. As can be seen from FIGS. 1A, 1B, since the propagating direction of the oscillations and the direction of the main displacement component are perpendicular to each other, it forms a resonator using transverse waves. That is, the resonator of the invention is basically different in view of the constitution from the existent resonator shown in FIGS. 2A, 2B using longitudinal waves in which the gravitational center 19g does not move.

The resonance frequency of the resonator according to the invention is determined as below. For example, assuming the piezoelectric thin film such that the velocity of the transverse waves of AlN is: Vsv=6057 m/s and the distance between the fixed sides at the right and the left ends is L, resonation occurs when L is about one-half of the wavelength of the transverse wave. Accordingly, the resonance frequency is given by: fr≈Vsv/(2×L). As described above, a resonator at: fr=20 MHz with L=150 μm can be obtained. Further, the thin film resonator in FIGS. 1A, 1B has a feature that the thickness of the piezoelectric thin film 16 is not a direct factor for determining the resonance frequency. That is, this is a reason capable of decreasing the thickness and the size of the resonator of the invention.

While consideration has been made for a 2-dimensional point of view referring to FIGS. 1A, 1B, since an actual resonator has a definite size also in the direction Y assuming the direction perpendicular to the surface of the drawing as the direction Y, it is also necessary to take the standing waves in the direction Y into consideration. For example, at fr=20 MHz, in a case where the size in the direction Y is large enough compared with the size in the direction X, the width in the direction X is: L≈150 μm in the same manner as described above. In a case where the size in the direction Y is substantially equal with the size in the direction X, that is, where the shape is nearly square, L≈210 μm.

The clamp pattern on the right and left sides in FIGS. 1A, 1B is not always necessary. Generally, in a case of forming a concavity 17 to the base substrate 15 such as made of Si as in FIGS. 2A, 2B, or in a case of forming a hole 21 by back etching to the substrate 15 as in FIGS. 1A, 1B, control for the direction of width is difficult. Since fluctuation in the direction of width causes fluctuation of the resonance frequency, control at high accuracy is necessary. Accordingly, when the concavity 17 as in FIGS. 2A, 2B or the hole 21 as in FIGS. 1A, 1B can be formed with good controllability, the clamp pattern 20 is sometimes not necessary. In a case where there is a problem for the controllability, the clamp pattern 20 is of significance. Generally, by forming the clamp pattern 20 by dry etching, lift off, etc., fluctuation in the direction of width can be suppressed sufficiently.

Further, as a material constituting the clamp pattern 20 by using a material having an acoustic impedance Zo=ρV (ρ: density, V: acoustic velocity) being greatly different from that of the piezoelectric thin film, most of oscillation can be reflected at the fixed sides. Since leakage of the oscillation energy to the clamp pattern 20 deteriorates a Q value (Quality Factor) of the resonator, it has to be decreased as much as possible.

As has been described above, it is possible in the invention to obtain a thin film resonator in which the lateral size of the piezoelectric thin film 16 determines the resonance frequency predominantly by the constitution in FIGS. 1A, 1B.

The resonator of the invention can also be integrated with the Si-based IC and the size can be decreased drastically as compared with those of using the existent quarts resonator. That is, by integrally incorporating the resonator of the invention into the IC substrate 15 incorporated with a semiconductor device a resonator-built in IC can be obtained, though this is not illustrated.

Further, while FIGS. 1A, 1B shows an example of aperturing a hole 21 to the base substrate 15 such as made of Si from the bottom by back etching, quite the same effect can be obtained also by forming the concavity 17 to the base substrate 15 and forming the resonator thereabove as shown in FIGS. 2A, 2B.

FIGS. 4A and 4B show an example of the constitution for an actual resonator in which the resonator of the invention shown in FIGS. 1A, 1B is viewed in the direction of the depth from the cross section thereof. FIG. 4A show a cross section along the plane which are identical with FIGS. 1A, 1B and shows a perspective view in the direction Y from the cross section. FIG. 4B is a cross sectional view along the plane XY, and they are perspective views in the direction –X from the cross section perpendicular to FIGS. 1A, 1B. The shape of the electrode 1 is shown by a broken line for a hidden portion. Electric supply to the electrode 1 is conducted by using a feed electrode 6 which is narrowed to such an extent as giving no substantial effects on the oscillations. Since the electrode itself is large enough, electric supply to the electrodes 2, 3 can be conducted from an optional place by leading from an appropriate portion and connecting for perpendicular direction by means of not illustrated via holes, etc.

An essential condition for the electrode material constituting the electrodes 1 to 3 is that the piezoelectric thin film 16 at high orientation can be formed on a metal thin film. As a result of various studies, it has been found that elemental metals such as molybdenum (Mo), platinum (Pt), tungsten (W), ruthenium (Ru), Gold (Au), etc. or alloys containing such elemental metals are preferred.

EXAMPLE 2

FIGS. 5A, 5B, FIGS. 6A, 6B, and FIGS. 7A, 7B show other examples of the invention. Generally, piezoelectric materials such as AlN, metal materials constituting the electrode, etc. have negative temperature characteristics that the acoustic velocity lowers as the temperature is higher. This means that a resonance frequency lowers as a temperature goes higher in a case of forming a resonator. Because of the negative temperature coefficient, the application use is restricted in a case of constituting a resonator by using the resonator of the invention shown in Example 1. Examples of FIGS. 5A, 5B, FIGS. 6A, 6B and FIGS. 7A, 7B solve such problem.

There is a material in which the acoustic velocity increases as the temperature goes higher such as silicon oxide ($SiO_2$), also this is an exceptional example. FIGS. 5A, 5B show an example of forming a dielectric film 7 for temperature compensation such as a $SiO_2$ film having a temperature characteristic opposite to that of AlN to the upper surface of the resonator having the constitution shown in FIGS. 1A, 1B. Generally, it has been known in SAW (Surface Acoustic Wave) filters that the temperature characteristic of the filters is improved by forming the dielectric film with an opposite temperature characteristic on a piezoelectric substrate.

For the thin film resonator, it has been found that the same effect can be obtained as a result of simulation and basic experiment with the constitution shown in FIGS. 5A, 5B.

Further, in FIGS. 6A, 6B and FIGS. 7A, 7B, for keeping symmetricity of oscillations of the piezoelectric thin film 16, FIGS. 6A, 6B show an example of forming a dielectric film 7 having a temperature characteristic opposite to that of the piezoelectric thin film 16 on the surface of upper and lower two piezoelectric thin films and FIGS. 7A, 7B show an example of forming a dielectric film 7 for temperature compensation between two piezoelectric thin films 16a, 16b, and disposing electrodes 1, 8 shorter than the electrodes 2, 3 about at the central portion on both sides thereof. It has been confirmed that they can obtain the effect equivalent with that of FIGS. 5A, 5B as a result of simulation and basic experiment.

EXAMPLE 3

FIGS. 8A, 8B, FIGS. 9A, 9B, and FIGS. 10A, 10B show other examples of the invention. In FIG. 8A, 8B, one of the two layers of dielectric thin films is removed (end of the piezoelectric thin film 16b of the upper layer is removed in this example) and a gap 22 is provided to decrease the thickness of the piezoelectric thin film in an equivalent manner. This intends to prevent the energy of oscillations from leaking by way of the clamp pattern 20 and to improve the Q value of the resonator.

Further, in FIGS. 9A, 9B, a temperature compensation film is further introduced to the constitution of FIGS. 8A, 8B intending to improve both the temperature characteristic in FIGS. 5A, 5B and improve the Q value in FIGS. 8A, 8B together.

Further more, in FIGS. 10A, 10B, the number of layers of the thin films is decreased near the clamp pattern 20 in the same manner as described above, but the thin film is fixed by the clamp pattern 20 by way of the dielectric film 7 for temperature compensation and metal thin films (electrodes 2, 3) on both surfaces thereof.

In addition to the examples described above, while various modifications may be considered, for example, such that a principal portion of the resonator at least including the piezoelectric thin film 16 and the dielectric film 7 by the clamp pattern 20 only by way of the metal thin film (electrodes 2, 3), it will be apparent that they are also included in the same category.

EXAMPLE 4

FIGS. 11A, 11B, FIGS. 12A, 12B, and FIGS. 13A, 13B show other examples. In FIGS. 11A, 11B, the dielectric body has a two layered structure in which the lower layer is a piezoelectric thin film 16 and the upper layer is a dielectric film 7 for temperature compensation. It is identical in that the resonance phenomenon occurs by the perpendicular displacement of the gravitational center of the dielectric thin film in the multi-layered structure. With this view point, also in the structure of FIGS. 11A, 11B, when the piezoelectric thin film 16 of the lower layer contracts and expands, the gravitational center of the two-layered dielectric thin films is displaced perpendicularly as a result. The conversion efficiency that the electric signals fed to the electrodes are converted by the dielectric thin film into oscillations is somewhat lowered compared with the case where both of the upper and lower layers are piezoelectric thin films 16 in FIGS. 1A, 1B. However, in a case of constituting particularly the oscillator or the like, lowering of the conversion efficiency can be compensated sufficiently by devising the circuit impedance or the like. This example can attain the object of the invention even by a simple thin film constitution.

In FIGS. 12A, 12B and FIGS. 13A, 13B, leakage of the energy of oscillations is lowered by decreasing the number of dielectric layers near the fixed sides by the clamp pattern 20 based on the constitution of FIGS. 11A, 11B. That is, as has been described above with reference to Example 3, the leakage of the energy can be lowered to thereby improve the Q value of the resonator by providing a gap 22 between the dielectric film 7 for temperature compensation on the piezoelectric thin film 16 as a portion of the dielectric layer and the clamp pattern 20 in FIGS. 12A, 12B, and by providing a gap 22 between the dielectric film 7 for temperature compensation on the piezoelectric thin film 16 as a portion of the dielectric layer and the clamp pattern 20 in FIGS. 13A and 13B together.

EXAMPLE 5

Figure 14:
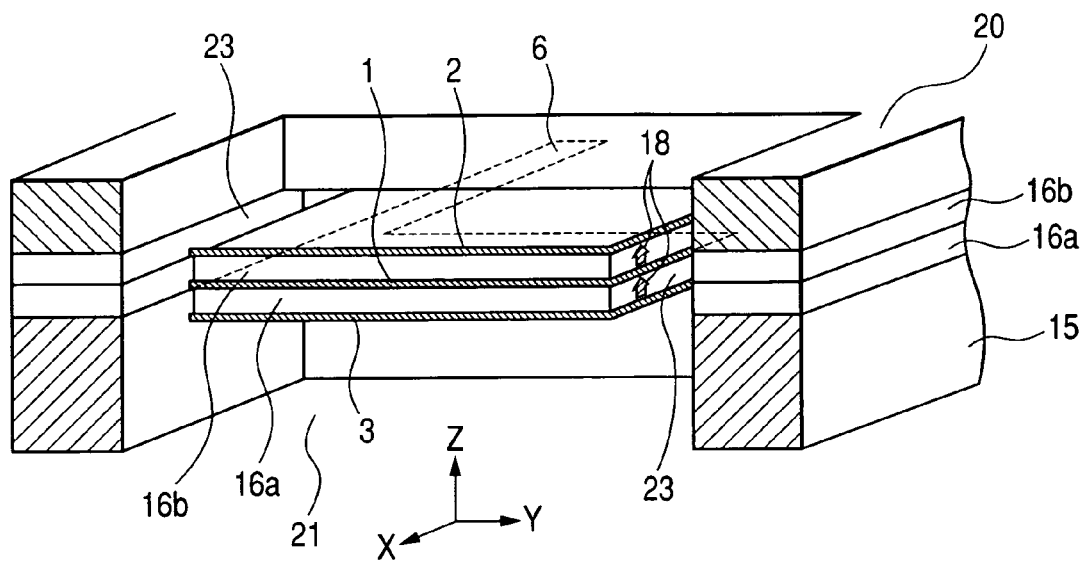
FIG. 14 is a perspective cross sectional view of a resonator for explaining a fifth example of the invention.

FIG. 14 shows other example of the invention. It is cross sectioned along the plane YZ in the same manner as in FIG. 4B and the drawing is a perspective view in the direction −X.

In the constitution of this example, fixing by the clamp pattern 20 is conducted only in the direction X and a gap 23 is provided on both ends in the direction Y to constitute free ends which are not fixed.

Such a structure can be formed easily by using the existent process technique particularly, dry etching or the like used for manufacturing semiconductor devices.

The constitution of example causes oscillations of scarcely generating standing waves in the direction Y and generating standing waves in the direction X. Assuming the clamp pattern distance in the direction X as L, the resonance frequency is given by: $fr \approx Vsv/(2 \times L)$. L is about 150 μm at $fr \approx 20$ MHz. In this example, since the free ends are provided in the direction Y with no clamp pattern, leakage of oscillation energy is suppressed and improvement of the Q value can be expected. Further, it will be apparent that the temperature characteristic of the resonator can be improved by introducing the dielectric film 7 for temperature compensation in the same manner as in FIGS. 5A, 5B, etc.

EXAMPLE 6

Figure 15:
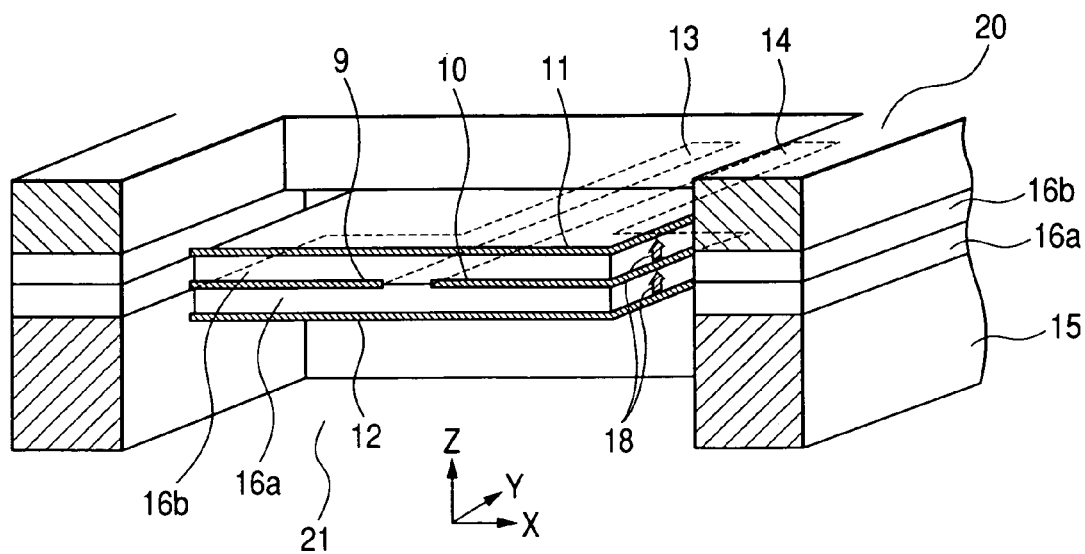
FIG. 15 is a perspective cross sectional view of a resonator for explaining a sixth example of the invention.

FIG. 15 shows other example of the invention. It is cross sectioned along the plane XY in the same manner as in FIG. 4A, and the drawing is a perspective view in the direction Y. In the constitution of this example, fixing by the clamp pattern 20 is conducted only in the direction Y and free ends are provided in the direction X which are not fixed. That is, this is a constitution opposite to FIG. 14 shown for Example 5.

In FIG. 15, a portion corresponding to the electrode 1 in FIG. 14 is bisected to constitute electrodes 9, 10 and one of potentials is applied to the electrode 9 within an identical plane constituting the resonator from a feeding electrode pattern 13 and the other of the potentials is applied within an identical plane constituting the resonator to the electrode 10 from a feeding electrode pattern 14. In the drawing, references 11 and 12 denote floating electrodes constituting the resonator.

Figure 16:
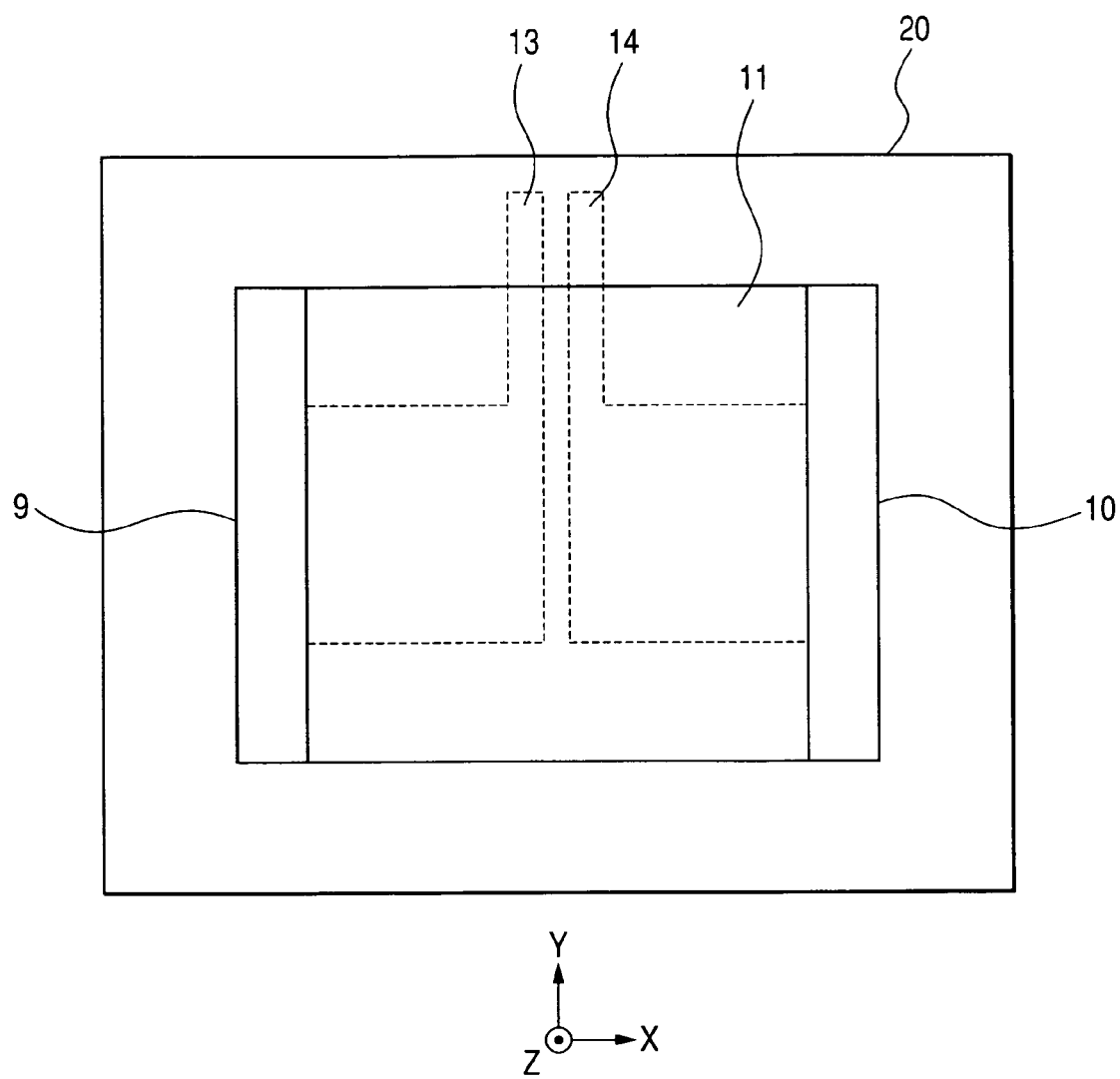
FIG. 16 is a perspective plan view of a resonator for explaining the sixth example of the invention.

FIG. 16 is a perspective plane view for the entire resonator constituting this example shown in FIG. 15 being observed from above. In FIG. 15 and FIG. 16, the shapes of the electrodes 9 and 10 are depicted by broken lines for hidden portions. The constitution has a feature in that the electrodes 9 and 10 which were a single sheet in the existent structure are constituted with two sheets as shown in the drawing and +/− electric supply is conducted between the electrodes 9 and 10. The electrodes 11 and 12 are floating electrodes with no electric supply different form the case of FIGS. 1A, 1B.

Figures 17A, 17B:
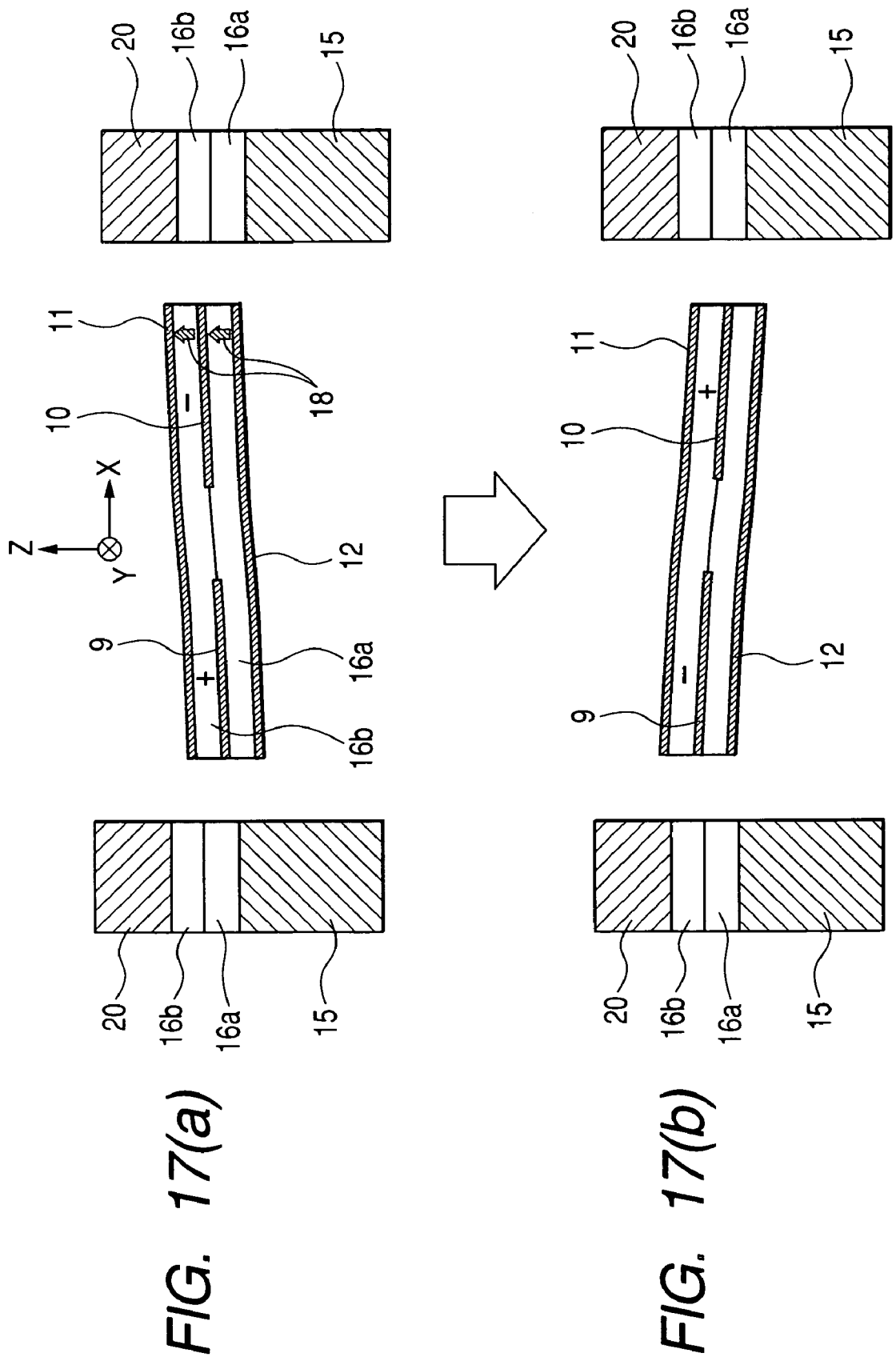
FIGS. 17A, 17B are cross sectional views of a resonator for explaining the sixth example of the invention.

FIGS. 17A, 17B are schematic views for explaining the operation state of the resonator shown in FIG. 15 and FIG. 16 and show the shape of oscillations in a case of electric supply between the electrodes 9 and 10.

In a case of applying a positive voltage to one electrode 9 and a negative voltage to the other electrode 10 as shown in FIG. 17A, since the electric line of force is generated from the electrode 9 to the upper and lower electrodes 11, 12, displacement in the downward direction, that is, in the direction −Z is caused as shown in FIG. 1A. For the other electrode 10, since the electric line of force is generated from the upper and lower electrodes 11, 12 to the electrode 10 due to the negative voltage, displacement in the upward direction, that is, in the direction +Z is caused as shown in FIG. 1B.

In a case where a negative voltage is applied to the electrode 9 and a positive voltage is applied to the electrode 10, the direction of the displacement is reversed as shown in FIG. 17B. Accordingly, the oscillation form is identical in that the main component of the displacement is in the direction Z.

However, this is represented by standing waves in which the direction of displacement is reversed at the center along the axis X. Since the both sides are fixed by the clamp pattern 20 in the direction Y, standing waves in which the fixed sides form nodes and the central portion forms a loop are generated.

Assuming the distance between the free sides in the direction X as Lx and the distance between the fixed sides in the direction Y as Ly, the resonance frequency fr is given by: $1/Lx^2+1/Ly^2 \approx (2fr)^2/Vsv^2$. Accordingly, assuming $Lx \approx Ly \approx L$, $L \approx 210$ μm at $fr \approx 20$ MHz. In this constitution, since the clamp pattern is not present in the direction X, leakage of the oscillation energy can be suppressed and improvement of the Q value can be expected.

Further, it will be apparent that the temperature characteristic of the resonator can be improved by introducing the dielectric film 7 for temperature compensation in the same manner as in FIGS. 5A, 5B, etc.

Figure 18:
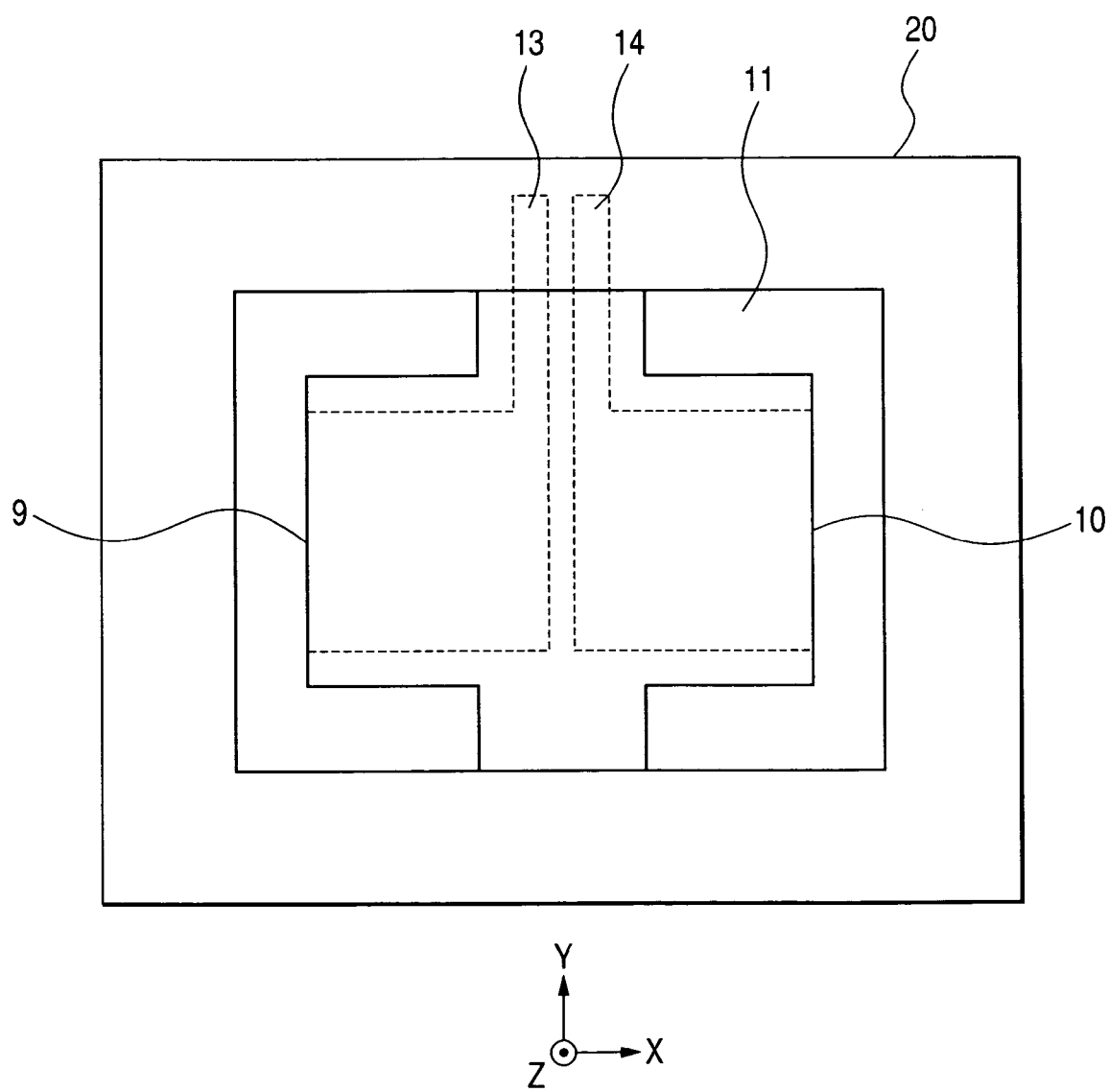
FIG. 18 is a perspective plan view of a resonator for explaining the sixth example of the invention.

Further, FIG. 18 shows a perspective plane view of a resonator similar to that in FIG. 16. This example has a constitution in which the width of the oscillation portion in the direction X is narrowed near the clamp pattern 20 in the direction Y. With such a constitution, since the side fixed by the clamp pattern 20 is restricted to a narrow portion where the displacement of oscillations is extremely small, leakage of the oscillation energy can be suppressed to be decreased extremely and further improvement can be expected for the Q value of the resonator.

EXAMPLE 7

Figure 19A:
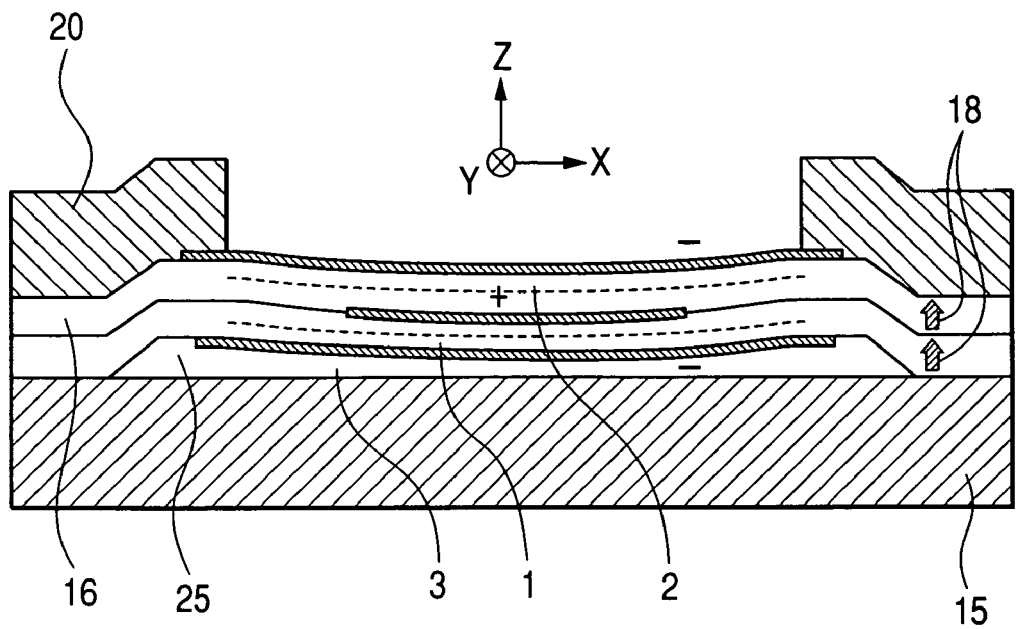
FIGS. 19A, 19B are cross sectional views of a resonator for explaining a seventh example of the invention.
Figure 19B:
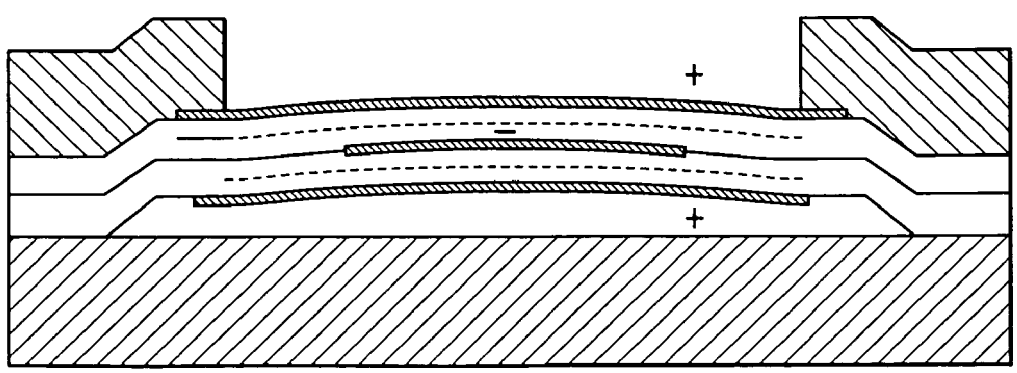

FIGS. 19A, 19B show other example of the invention. While the basic structure is identical with that in FIGS. 1A, 1B, this is an advantageous structure considering hybridization in the feature Si series IC. This is a structure in which a back etching as that for the base substrate in FIGS. 1A, 1B is not used and the oscillation portion is floated by way of an air gap on a uniform Si substrate. This is somewhat similar to FBAR in FIGS. 2A, 2B but it is suitable to hybridization with IC in that engraving of the Si base substrate as in FIGS. 2A, 2B is not necessary. Further, while there are various methods of forming the air gap, it can be attained generally by at first forming a sacrificial layer, forming a necessary piezoelectric thin film layer, electrode, etc. thereover and removing the sacrificial layer by etching substantially in the final step. Further, the constitution of FIGS. 19A, 19B is only an example and it will be apparent to include the constitutions from FIGS. 5A, 5B to FIG. 18 formed by way of the air gap 25 as shown in FIGS. 19A, 19B.

EXAMPLE 8

Figure 20A:
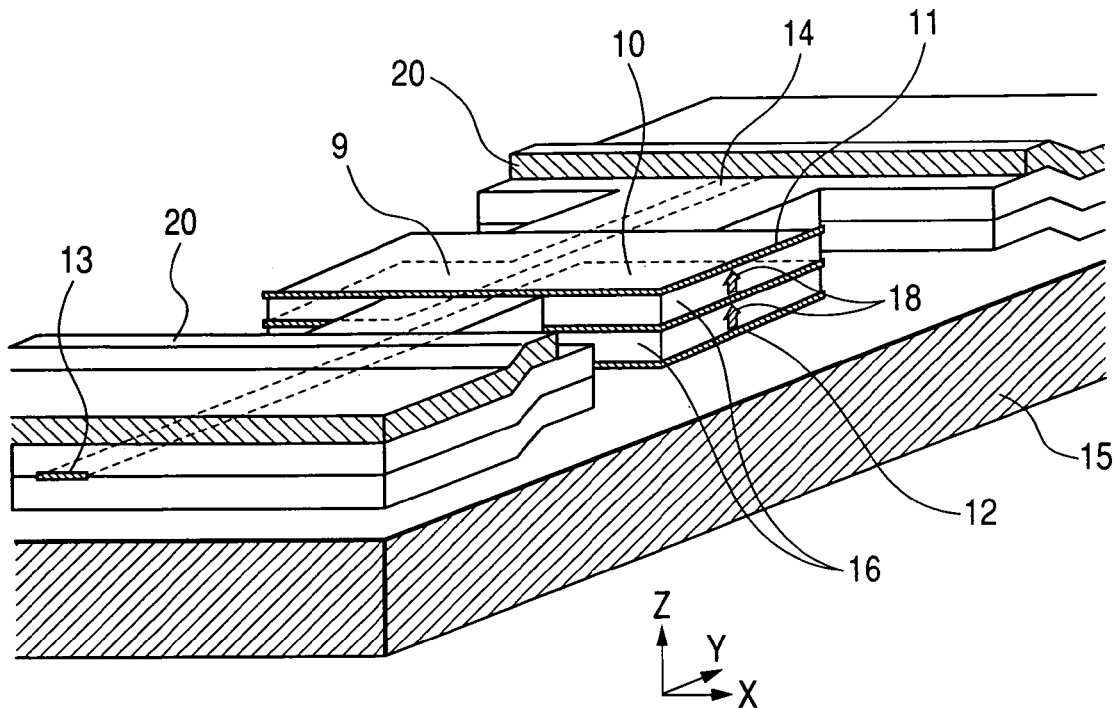
FIG. 20A is a perspective view of a resonator for explaining an eighth example of the invention.
Figure 20B:
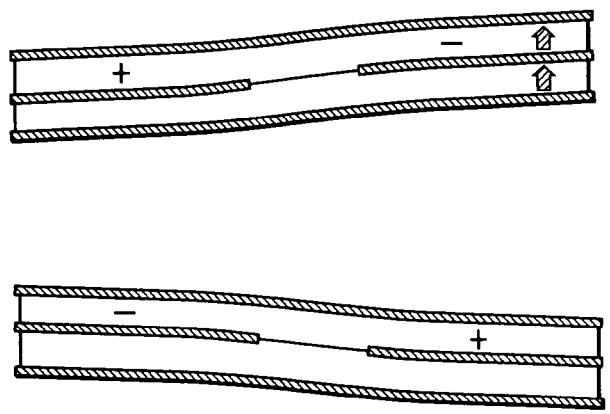
FIG. 20B is a cross sectional view of the resonator for explaining the eighth example of the invention.

FIGS. 20A, 20B and FIGS. 21A, 21B show other examples of the invention. They are obtained based on the structures of FIG. 15, FIG. 16, FIGS. 17A, 17B and FIG. 18 by using the air gap as shown in FIGS. 19A, 19B. In FIG. 20A, when a high frequency voltage is applied to feeding electrodes 13, 14, oscillations in the same manner as in FIGS. 17A, 17B can be conducted as shown at the cross section XZ in FIG. 20B. In this case, since the side fixed by the clamp pattern is narrowed for the width in the direction X in the same manner as in FIG. 18, this provides a structure capable of extremely restricting the leakage of the oscillation energy.

FIG. 21A is similar with FIG. 20A and the basic operation is substantially identical with that in FIGS. 1A, 1B. That is, a high frequency voltage is applied between the electrode 1 and the electrodes 2, 3. As also shown along the cross section XZ in FIG. 21B, in a case where the electrode 1 is at a positive voltage and the electrodes 2, 3 great the negative voltage, the gravitational center moves to the direction −Z, whereas in a case where the electrode 1 is at a negative voltage and the electrodes 2, 3 are at the positive voltage, the gravitational center moves in the direction +Z.

As can be seen from FIG. 21A, since the both ends in the direction X are not fixed and fixing by the clamp pattern is conducted at a central portion in this structure, oscillations are in right to left symmetry along the axis X. Since the fixed side is narrowed for the width in the direction X in the same manner as in FIG. 18, leakage of oscillation energy can be restricted extremely.

While FIGS. 20A, B and FIGS. 21A, B show examples where the oscillations are right-to-left antisymmetry or right-to-left symmetry along the axis X, it is not always necessary that they are right to left symmetry in view of the characteristic and it will be apparent that a case using asymmetric oscillations is also included in the invention.

EXAMPLE 9

Figure 22:
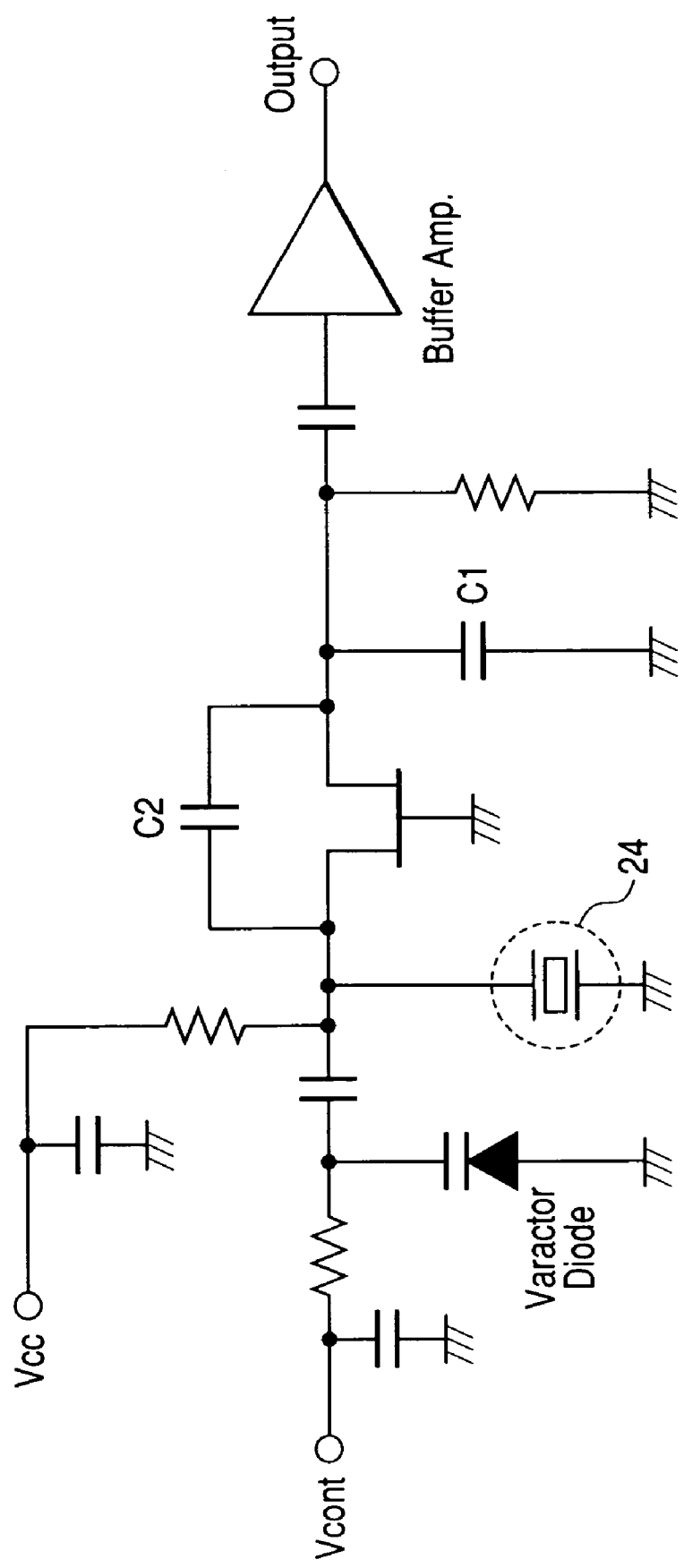
FIG. 22 is an equivalent circuit diagram of a semiconductor IC incorporating a resonator for explaining a ninth example of the invention.

FIG. 22 is an equivalent circuit diagram of a semiconductor IC monolithically incorporating a resonator 24 of the invention. The piezoelectric thin film resonator 24 of the invention is used for the resonator portion of a colpitts type oscillator. The resonator 24 has a constitution as exemplified in Examples 1 to 8 and since it is prepared by a thin film technique, it can be reduced extremely in the size and in the thickness compared with the existent resonator. Further, since the Si-based substrate 15 is used as the base substrate, it is integrated with peripheral active elements formed on one identical substrate as illustrated.

Further, the resonator introduced with the temperature compensation film 7 is also excellent in the temperature characteristics. Further, in a case of also adding a temperature compensation function in view of circuit using a variable capacitance or the like to a portion of a peripheral circuit, a performance comparable with that of the existent TCXO (Temperature Compensated Crystal Oscillator) can be attained in a supermicro size and at a reduced thickness.

The present invention concerns a standard oscillator such as TCXO essentially used in plurality in electronic equipment, for example, portable telephones, personal computers, and digital cameras. Since quartz resonators have been used so far, reduction in the size and in the thickness, as well as integration with the S-based IC are limited. However, since the resonator portion as a key component can be formed by the Si-based thin film technology according to the invention, it is possible to reduce the size and the thickness and to integrate with the Si-based IC of TCXO and there is great industrial worth.

What is claimed is:

1. A piezoelectric thin film resonator comprising:
a first piezoelectric thin film;
a second piezoelectric thin film formed on an upper surface of the first piezoelectric thin film;
a first electrode formed on a lower surface of the first piezoelectric thin film;
a second electrode formed between the first and second piezoelectric thin films; and
a third electrode formed on an upper surface of the second piezoelectric thin film;
wherein said second electrode is bisected and a high frequency voltage is applied between one electrode and the other electrode, and
wherein said first and said third electrode are floating electrodes with no electric supply, thereby causing the direction of the electric field in the first piezoelectric thin film which is located under said one electrode and the direction of the electric field in the second piezoelectric thin film which is located above said one electrode mutually to become opposite and periodically inverted, and thereby causing the direction of the electric field in the first piezoelectric thin film which is located under said the other electrode and the direction of the electric field in the second piezoelectric thin film which is located above said the other electrode mutually to become opposite and periodically inverted, and wherein the displacement component perpendicular to the plane of all the first and second piezoelectric thin films is predominant for the displacement of oscillation in the first and second piezoelectric thin films at the resonance frequency, and the direction of the displacement perpendicular to the plane is reversed at the center of the cross section perpendicular to the plane.

2. The piezoelectric thin film resonator according to claim 1, further comprising:

a non-piezoelectric thin film formed on an upper surface of the piezoelectric thin film resonator, wherein the non-piezoelectric thin film has a characteristic opposite to that of the first and second piezoelectric thin films with respect to temperature.

3. The piezoelectric thin film resonator according to claim 2, wherein the non-piezoelectric thin film comprises $SiO_2$.

4. The piezoelectric thin film resonator according to claim 1, wherein the first and second piezoelectric thin films comprise crystals in the form of a hexagonal system (6 mm group), and the C-axis is perpendicular to the plane of the first and second piezoelectric thin films.

5. The piezoelectric thin film resonator according to claim 1, wherein the first and second piezoelectric thin films contain AlN or ZnO.

6. The piezoelectric thin film resonator according to claim 1, wherein the metal thin film constituting the first, second and third electrodes comprises an elemental metal selected from the group comprised of Mo, W, Ti, Pt, and Au, or an alloy containing such elemental metal elements.

7. The piezoelectric thin film resonator according to claim 1, further comprising:

a first non-piezoelectric thin film formed on an upper surface of the piezoelectric thin film resonator; and a second non-piezoelectric thin film formed on a lower surface of the piezoelectric thin film resonator, wherein the first and second non-piezoelectric thin film have a characteristic opposite to that of the first and second piezoelectric thin films with respect to temperature.

8. The piezoelectric thin film resonator according to claim 7, wherein the first and second non-piezoelectric thin films comprise $SiO_2$.

* * * * *